US012652827B2

(12) United States Patent
Frougier et al.

(10) Patent No.: US 12,652,827 B2
(45) Date of Patent: Jun. 9, 2026

(54) NANOSHEET TRANSISTORS WITH BURIED POWER RAILS

(71) Applicant: International Business Machines Corporation, Armonk, NY (US)

(72) Inventors: Julien Frougier, Albany, NY (US); Nicolas Loubet, Guilderland, NY (US); Sagarika Mukesh, Albany, NY (US); Prasad Bhosale, Albany, NY (US); Ruilong Xie, Niskayuna, NY (US); Andrew Herbert Simon, Fishkill, NY (US); Takeshi Nogami, Schenectady, NY (US); Lawrence A. Clevenger, Saratoga Springs, NY (US); Roy R. Yu, Poughkeepsie, NY (US); Andrew M. Greene, Slingerlands, NY (US); Daniel Charles Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 1045 days.

(21) Appl. No.: 17/486,840

(22) Filed: Sep. 27, 2021

(65) Prior Publication Data

US 2023/0094466 A1 Mar. 30, 2023

(51) Int. Cl.
*H10D 30/67* (2025.01)
*H10D 30/01* (2025.01)
(Continued)

(52) U.S. Cl.
CPC ....... *H10D 30/6713* (2025.01); *H10D 30/031* (2025.01); *H10D 30/6735* (2025.01);
(Continued)

(58) Field of Classification Search
CPC .......... H01L 29/78618; H01L 29/0649; H01L 29/0665; H01L 29/42392; H01L 29/66742;
(Continued)

(56) References Cited

U.S. PATENT DOCUMENTS

| | | | |
|---|---|---|---|
| 7,002,187 B1 | 2/2006 | Husher | |
| 9,570,395 B1 | 2/2017 | Sengupta | |

(Continued)

FOREIGN PATENT DOCUMENTS

| | | | |
|---|---|---|---|
| EP | 3454366 A1 | 3/2019 | |

OTHER PUBLICATIONS

A. Gupta et al., "Buried Power Rail Integration with Si FinFETs for CMOS Scaling beyond the 5 nm Node," Symposium on VLSI Technology, 2020, THL.6, 2 pp.
(Continued)

*Primary Examiner* — Jessica S Manno
*Assistant Examiner* — Andrew Chung
(74) *Attorney, Agent, or Firm* — Harrity & Harrity, LLP

(57) ABSTRACT

A semiconductor structure includes a substrate and a first field effect transistor (FET) formed on the substrate; the first FET includes a first FET first source-drain region, a first FET second source-drain region, a first FET gate between the first and second source-drain regions, and a first FET channel region adjacent the first FET gate and between the first FET first and second source-drain regions. Also included is a buried power rail, buried in the substrate, having a top at a level lower than the first FET channel region, and having buried power rail sidewalls. A first FET shared contact is electrically interconnected with the buried power rail and the first FET second source-drain region, and a first FET elec- (Continued)

trically isolating region is adjacent the buried power rail sidewalls and separates the buried power rail from the substrate.

12 Claims, 39 Drawing Sheets

(51) Int. Cl.

| | | |
|---|---|---|
| *H10D 62/10* | (2025.01) | |
| *H10D 84/01* | (2025.01) | |
| *H10D 84/03* | (2025.01) | |
| *H10W 20/41* | (2026.01) | |

(52) U.S. Cl.
CPC ....... *H10D 30/6757* (2025.01); *H10D 62/115* (2025.01); *H10D 62/118* (2025.01); *H10D 84/0149* (2025.01); *H10D 84/0151* (2025.01); *H10D 84/038* (2025.01); *H10W 20/435* (2026.01)

(58) Field of Classification Search
CPC ....... H01L 29/78696; H01L 21/823475; H01L 21/823481; H01L 23/5283; H01L 29/0673; H10D 30/6713; H10D 30/6757; H10D 30/031; H10D 84/0151; H10D 84/038; H10D 84/0149; H10D 62/118; H10D 62/115
See application file for complete search history.

(56) References Cited

U.S. PATENT DOCUMENTS

| | | | | |
|---|---|---|---|---|
| 10,374,040 | B1 * | 8/2019 | Chanemougame | ........................... H10D 84/0186 |
| 10,388,519 | B2 | 8/2019 | Smith | |
| 10,586,765 | B2 | 3/2020 | Smith | |
| 10,734,224 | B2 | 8/2020 | Smith | |
| 2013/0200461 | A1 * | 8/2013 | Liu | .................... H10D 84/0186 257/E21.585 |
| 2018/0026042 | A1 | 1/2018 | Smith | |
| 2019/0080969 | A1 | 3/2019 | Tsao | |
| 2019/0288004 | A1 * | 9/2019 | Smith | .............. H01L 21/76895 |
| 2019/0386011 | A1 | 12/2019 | Weckx | |
| 2020/0134128 | A1 | 4/2020 | Peng | |
| 2020/0135578 | A1 | 4/2020 | Ching | |
| 2020/0135634 | A1 | 4/2020 | Chiang | |

OTHER PUBLICATIONS

A. Veloso et al., "Nanowire & nanosheet FETs for ultra-scaled, high-density logic and memory applications," Solid-State Electronics, vol. 168, 2020, 107736, 7 pp.
Bilal Chehab et al., "Standard cell architectures for N2 node: transition from FinFET to nanosheet and to forksheet device," Proc. SPIE 11328, Design-Process-Technology Co-optimization for Manufacturability XIV, 1132807, Mar. 23, 2020, 8 pp.

* cited by examiner

X - CROSS-GATE

Y - CROSS-FIN

X - CROSS-GATE

Y - CROSS-FIN

X - CROSS-GATE

Y - CROSS-FIN

NANOSHEET TRANSISTORS WITH BURIED POWER RAILS

BACKGROUND

The present invention relates generally to the electrical, electronic and computer arts and, more particularly, to nanosheet field effect transistors.

The well-known field-effect transistor (FET) is a device that uses an electric field to control the flow of current in a semiconductor, and typically includes source, gate, drain (and body) terminals. FET devices control the flow of current by the application of a voltage to the gate, which in turn alters the conductivity in the channel between the drain and source. The fin-type field effect transistor (FinFET) is a multi-gate device, built on a substrate, with the gate placed on two or more sides of the channel or wrapped around the channel, thus forming a multiple-gate structure. FinFET devices have significantly faster switching times and higher current density than planar CMOS (complementary metal-oxide-semiconductor) FET technology.

Further advances beyond FinFETs have been proposed in the form of semiconductor nanowires employed as metal-oxide-semiconductor field-effect transistor (MOSFET) channels which can enable a gate-surrounding structure allowing good electrostatic gate control over the channel for reducing short-channel effects. Similar to lateral nanowire FETs, nanosheet FETs use wider and thicker wires to provide improved electrostatics and drive current.

Buried power rails (BPRs) have been proposed for increased integrated circuit (IC) device density/reduction of standard cell size. However, conventional BPRs may suffer from metal contamination as BPR metal is formed in the early stages of device fabrication (e.g., fin or nanosheet module). Furthermore, in conventional BPR integration, there can be parasitic stress generation in adjacent devices that can harm performance. Furthermore, BPRs integrated below the active device into the substrate can increase substrate-to-BPR parasitic capacitance and negatively impact device performance.

BRIEF SUMMARY

Principles of the invention provide techniques for nanosheet transistors with buried power rails; in a non-limiting example, gate-all-around nanosheet transistors with BPRs and air-gaps. In one aspect, an exemplary semiconductor structure includes a substrate; a first field effect transistor (FET) formed on the substrate and including a first FET first source-drain region, a first FET second source-drain region, a first FET gate between the first and second source-drain regions, and a first FET channel region adjacent the first FET gate and between the first FET first and second source-drain regions; a buried power rail, buried in the substrate, having a top at a level lower than the first FET channel region, and having buried power rail sidewalls; a first FET shared contact electrically interconnected with the buried power rail and the first FET second source-drain region; and a first FET electrically isolating region adjacent the buried power rail sidewalls and separating the buried power rail from the substrate.

In a further aspect, an exemplary semiconductor array structure includes a substrate, and a plurality of field effect transistors formed on the substrate, each including a first source-drain region, a second source-drain region, a gate between the first and second source-drain regions, and a channel region adjacent the gate and between the first and second source-drain regions. The plurality of field effect transistors are arranged in rows; and a plurality of buried power rails are buried in the substrate. Each has a top at a level lower than the channel regions, and each has buried power rail sidewalls. A plurality of shared contacts are electrically interconnected with the buried power rails and the second source-drain regions. Electrically isolating regions are adjacent the buried power rail sidewalls of each of the plurality of buried power rails and separate the buried power rails from the substrate. the buried power rails are located between adjacent rows of the field effect transistors.

In still a further aspect, an exemplary method of forming a semiconductor structure includes epitaxially forming a plurality of nanosheet stacks on a substrate to obtain a first precursor structure. The nanosheet stacks are separated by a plurality of gaps, and the first precursor structure has an outer surface. Further steps include depositing at least one shallow trench isolation liner over the outer surface of the first precursor structure and depositing shallow trench isolation oxide in the plurality of gaps over the at least one liner; replacing the shallow trench isolation oxide in select ones of the plurality of gaps with buried power rails surrounded by electrically isolating regions; and forming a plurality of rows of field effect transistors on the substrate, with the buried power rails located between adjacent rows of the field effect transistors.

As used herein, "facilitating" an action includes performing the action, making the action easier, helping to carry the action out, or causing the action to be performed. Thus, by way of example and not limitation, instructions executing on a processor might facilitate an action carried out by semiconductor fabrication equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

For a BPR, eliminating or at least reducing the risk of metal diffusion in the sub-fin region (metal atoms cannot diffuse through the air-gap);

Mitigating the risk of stress generation from a BPR to adjacent devices, since the air-gap can absorb some of the stress (damping effect);

Since air-gap spacers provide low-K (low electrical conductivity) isolation, they help reduce substrate-to-BPR parasitic capacitance and can potentially improve device performance.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1:
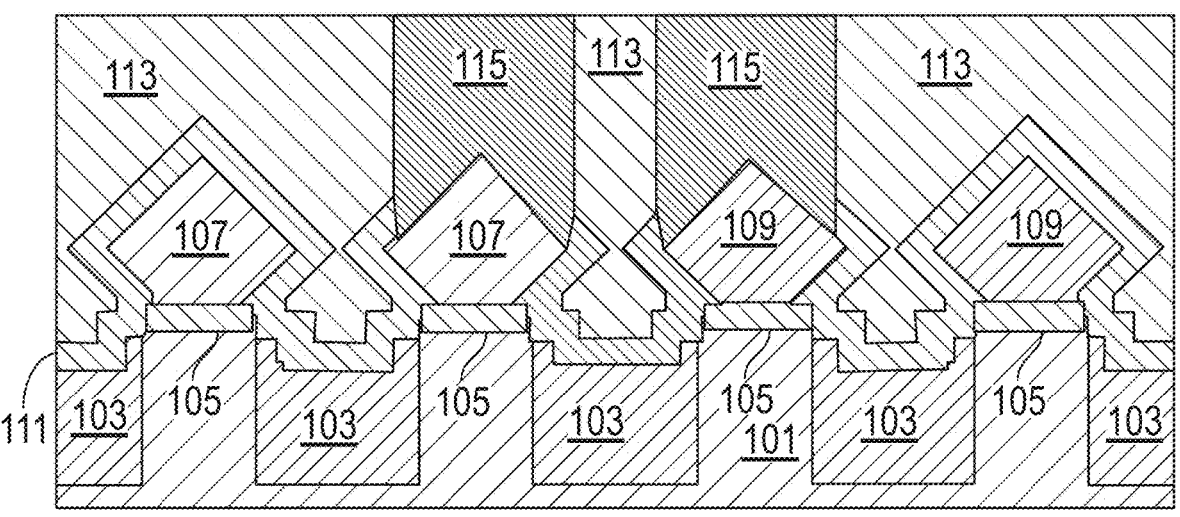
FIG. 1 shows a prior-art structure.

As noted, further advances beyond FinFETs have been proposed in the form of semiconductor nanowires employed as metal-oxide-semiconductor field-effect transistor (MOS-FET) channels which can enable a gate-surrounding structure allowing good electrostatic gate control over the channel for reducing short-channel effects, and, similar to lateral nanowire FETs, nanosheet FETs use wider and thicker wires to provide improved electrostatics and drive current. FIG. 1 shows a prior-art nanosheet structure that does not employ buried power rails. Note the silicon substrate 101, silicon oxide insulators 103, and bottom dielectric isolation (BDI) 105. Note further n-type epitaxially grown source-drain regions 107 and p-type epitaxially grown source-drain regions 109; Contact Etch-Stop Liner (CESL) 111; interlayer dielectric 113; and Source-Drain metal contacts 115.

Figure 2:
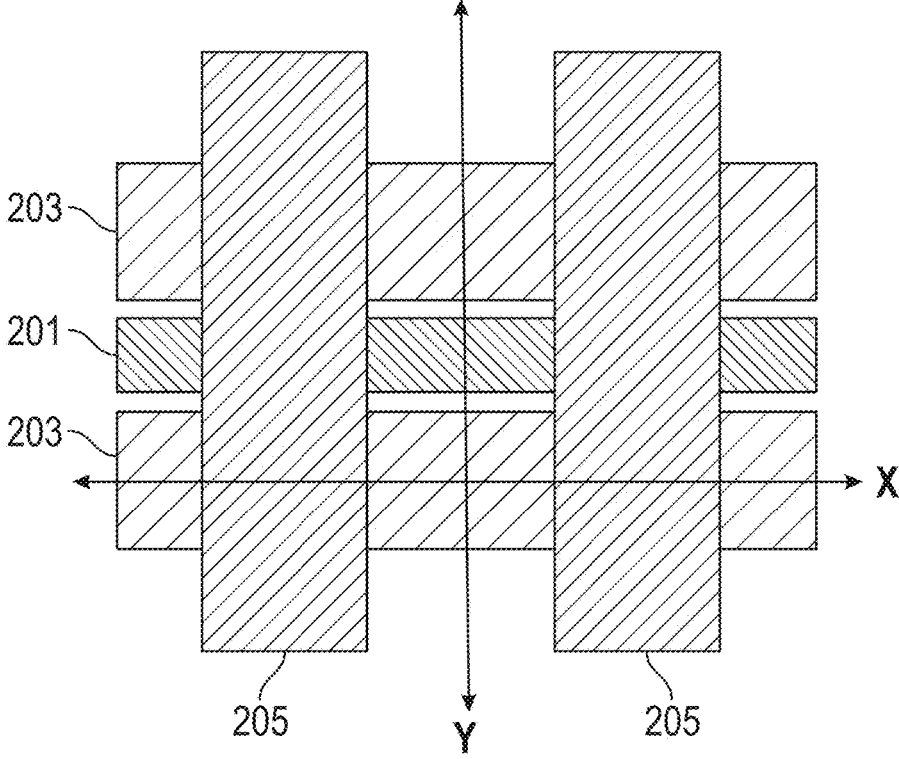
FIG. 2 shows a top view representative of one or more exemplary embodiments.
Figures 3, 4:
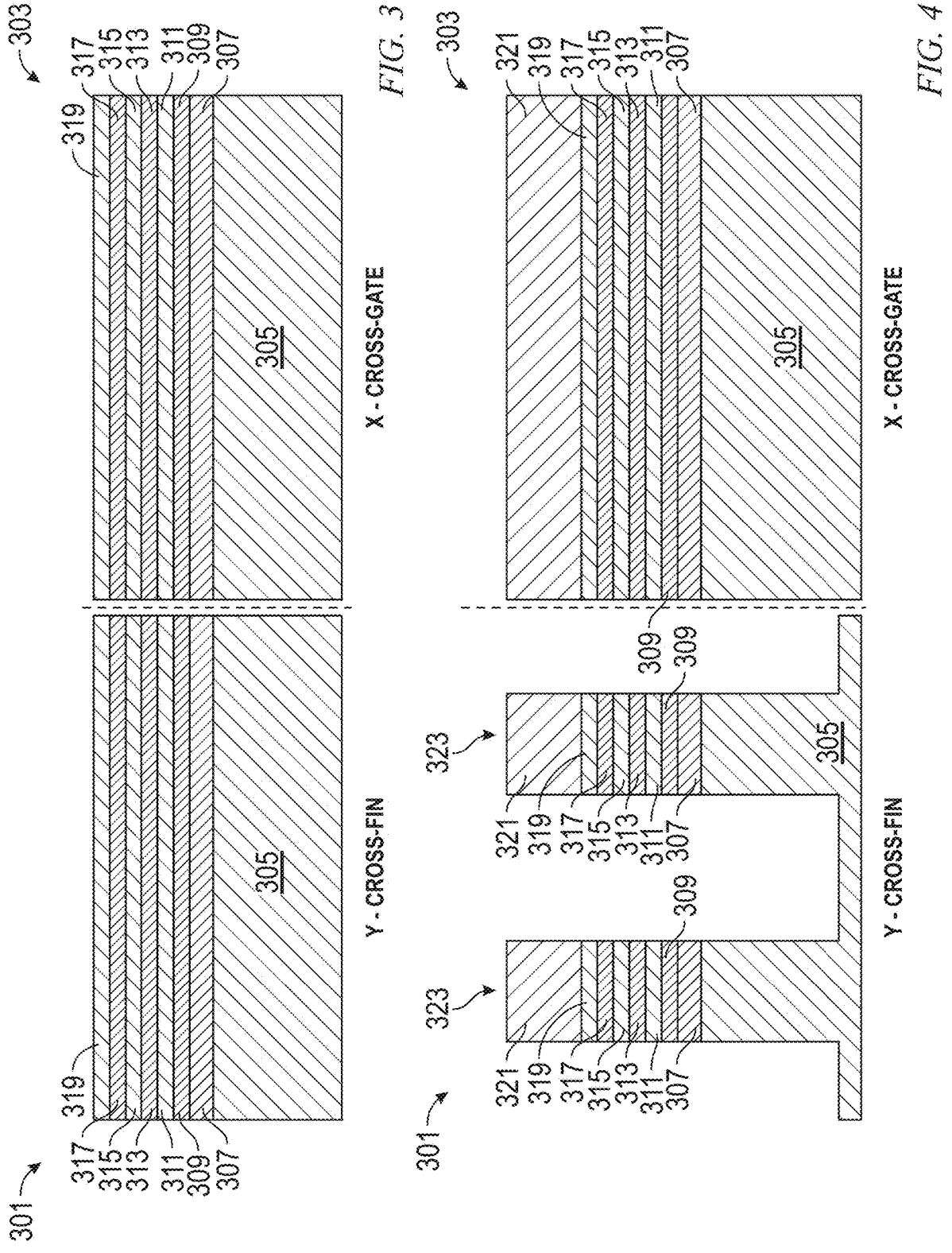
FIGS. 3-17 show exemplary fabrication steps for a first embodiment.

Referring now to FIG. 2, consider a first exemplary process flow for an exemplary embodiment of nanosheet transistors with buried power rails. FIG. 2 is a top plan view. Note buried power rail 201, lines X and Y, nanosheet stacks 203; and gates 205. FIG. 3 shows epitaxial growth of the nanosheet stack. In each of FIGS. 3-18, 20-30, and 32-47, the left-hand view 301 is a cross-fin view along line Y in FIG. 2, while the right-hand view 303 is a cross-gate view over active device along line X in FIG. 2. Note silicon substrate 305, silicon germanium 50% layer 307, and alternating layers of silicon germanium 25% 309, 313, 317 and silicon 311, 315, 319. Note that these specific ranges are exemplary; in general, layer 307 can include SiGe with the Ge % ranging from 40-75% while layers 309, 313, and 317 can include SiGe with the Ge % ranging from 15-35%.

Figures 5, 6:
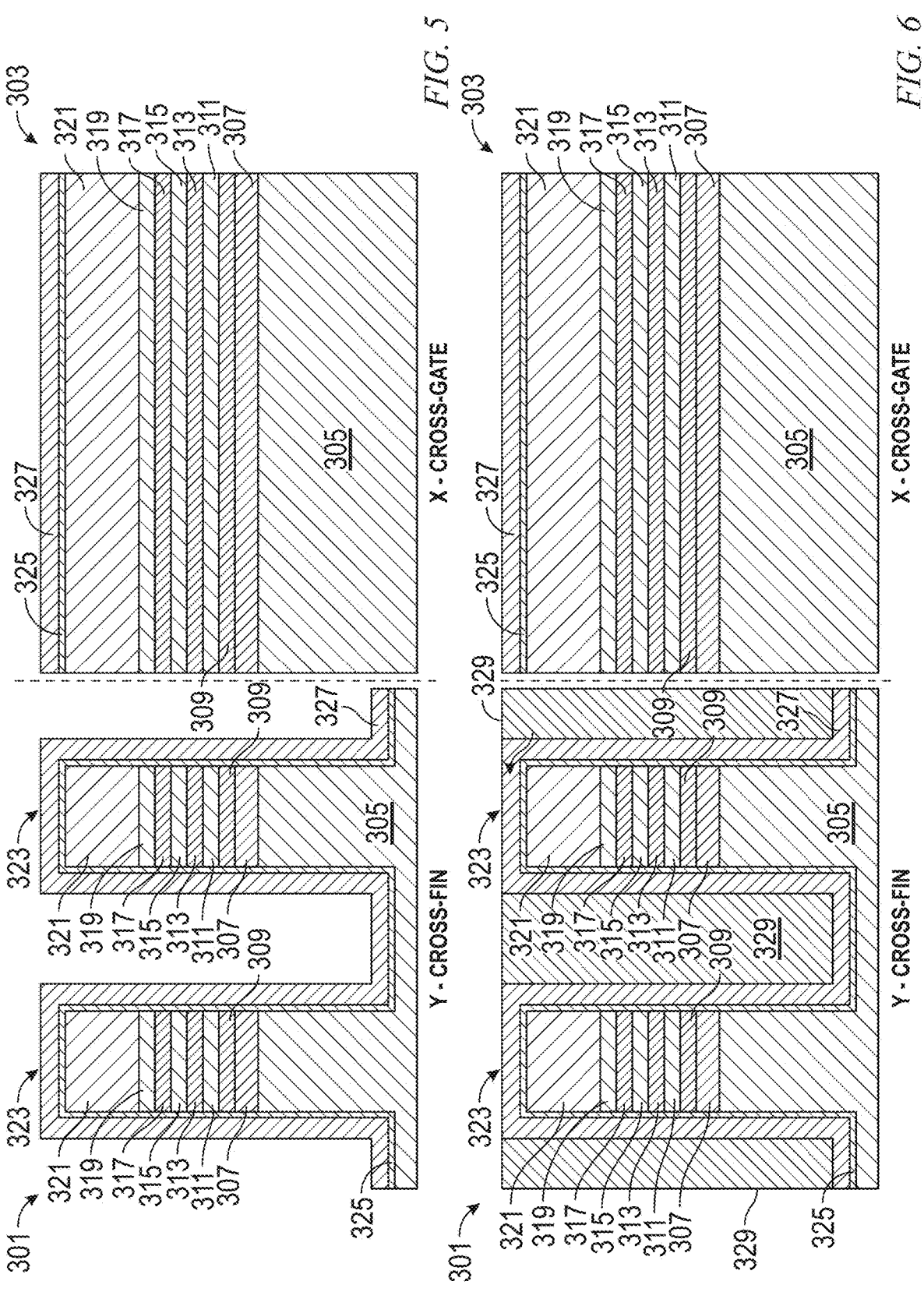
Figure 7:
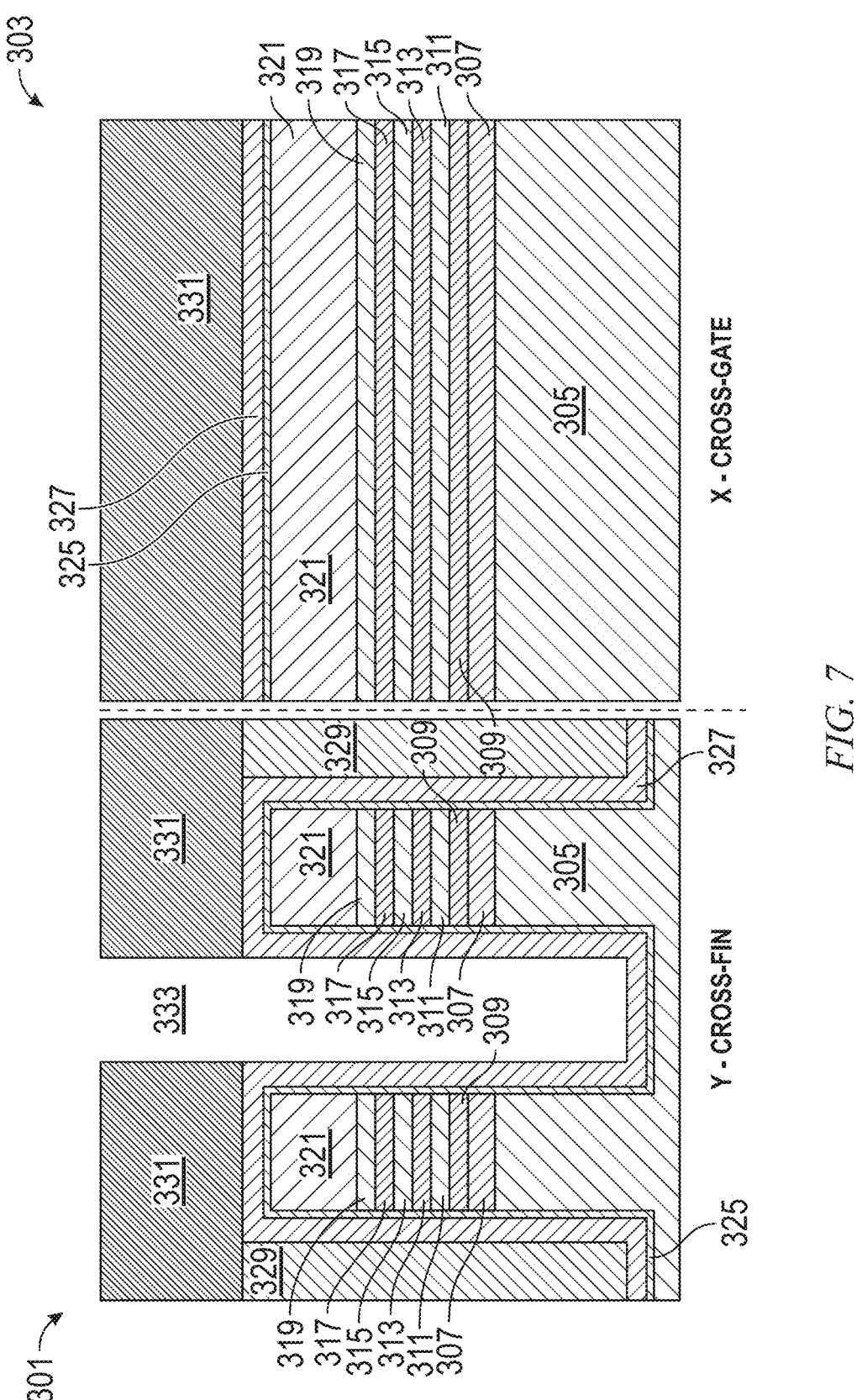
Figures 8, 9:
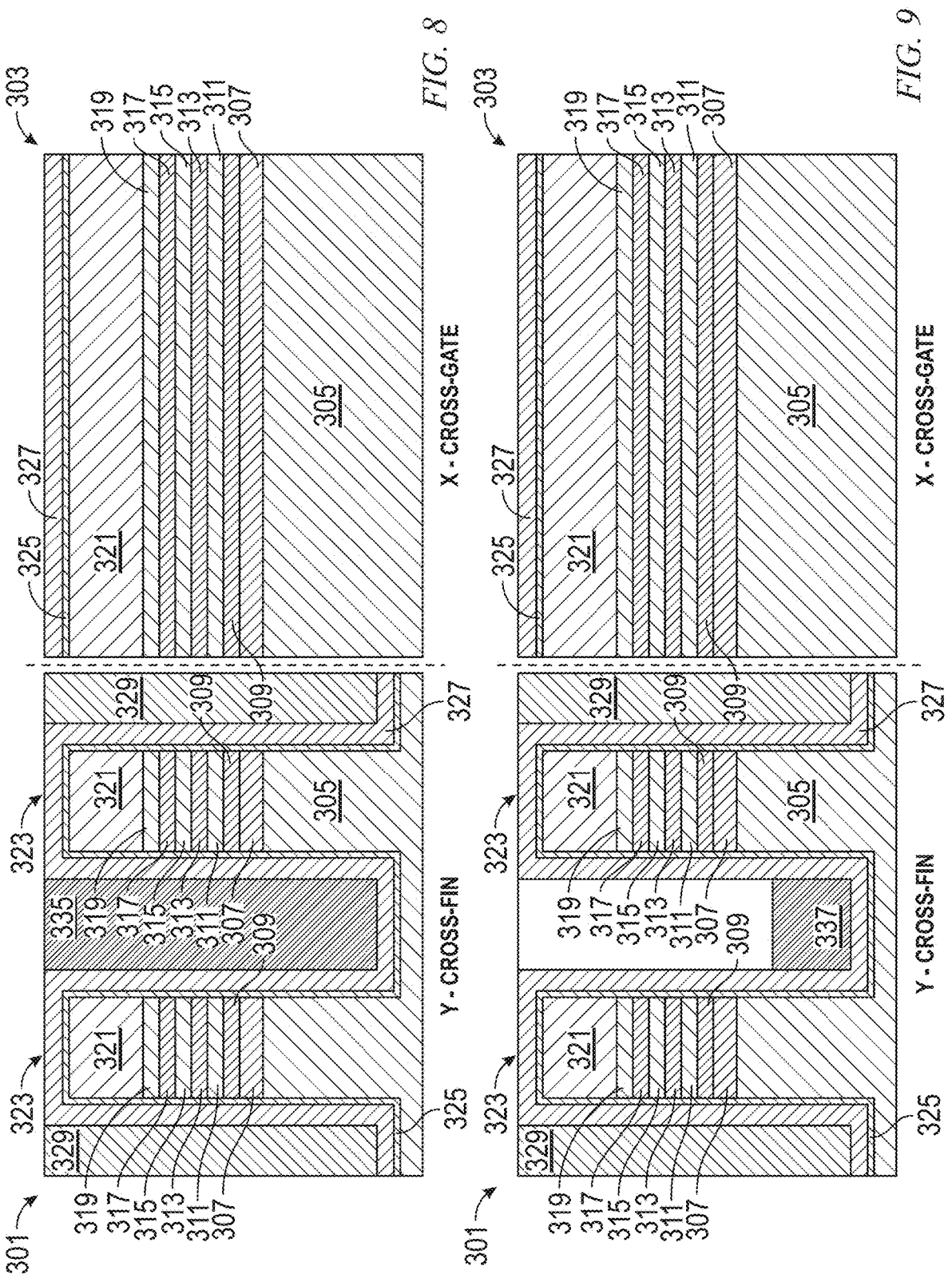
Figure 10:
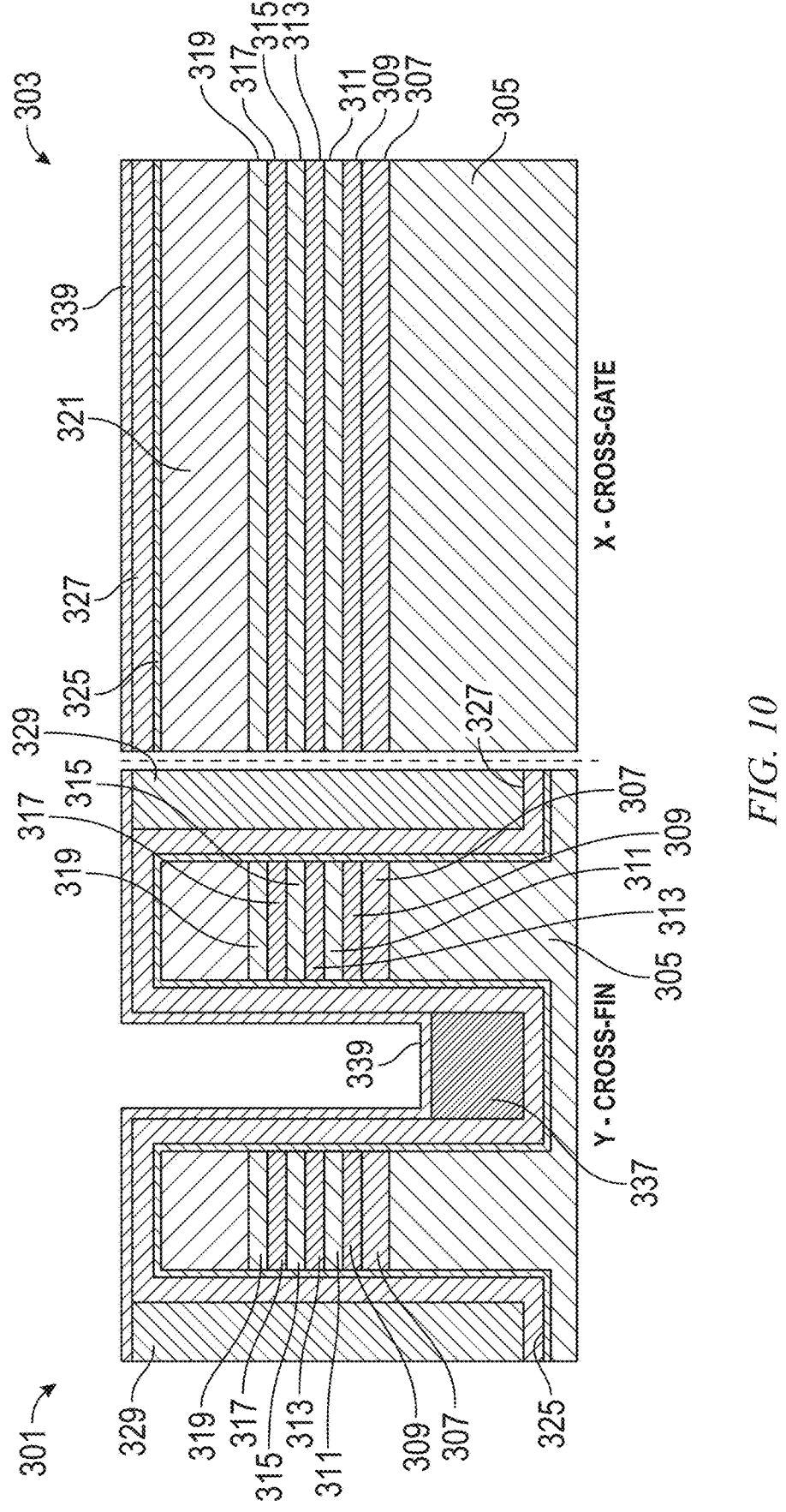

In FIG. 4, apply hard mask 321 (e.g., layer or multi layers of dielectrics), pattern same, and etch to form nanosheet stacks (NS) 323. In FIG. 5, deposit shallow trench isolation (STI) conformal liners (e.g., silicon oxide (SiO) 325 and silicon nitride (SiN) 327). In FIG. 6 deposit STI silicon oxide fill (SiO) 329 and carry out chemical-mechanical polishing (CMP). In FIG. 7, deposit and pattern an organic dielectric layer (ODL) 331. Using a suitable etchant, recess the shallow trench isolation (STI) oxide 329 to create a region 333. In FIG. 8, strip the ODL layer 331, deposit (overfill) buried power rail metal 335 (e.g., tungsten, ruthenium, or cobalt) and carry out CMP on the BPR metal. In FIG. 9, recess the BPR metal 335 with a suitable etchant to obtain rail 337; in some examples, the rail 337 can have a cross section of about 50 nm by 50 nm. In FIG. 10, deposit BPR conformal liner material 339; e.g., SiN deposited via Plasma Enhanced Atomic Layer Deposition (PEALD), Plasma Enhanced Chemical Vapor Deposition (PECVD), or Atomic Layer Deposition (ALD).

Figure 11:
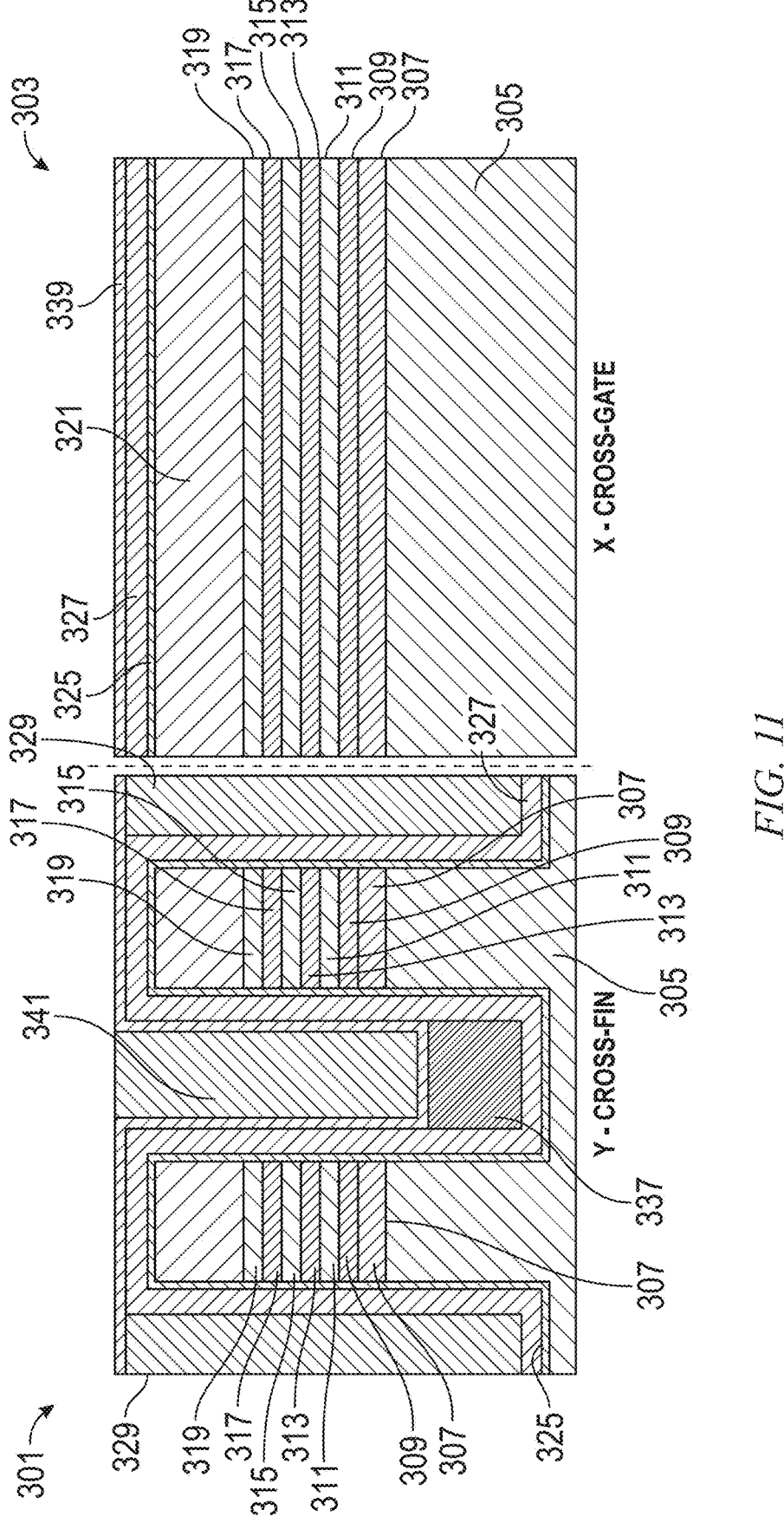
Figures 12, 13:
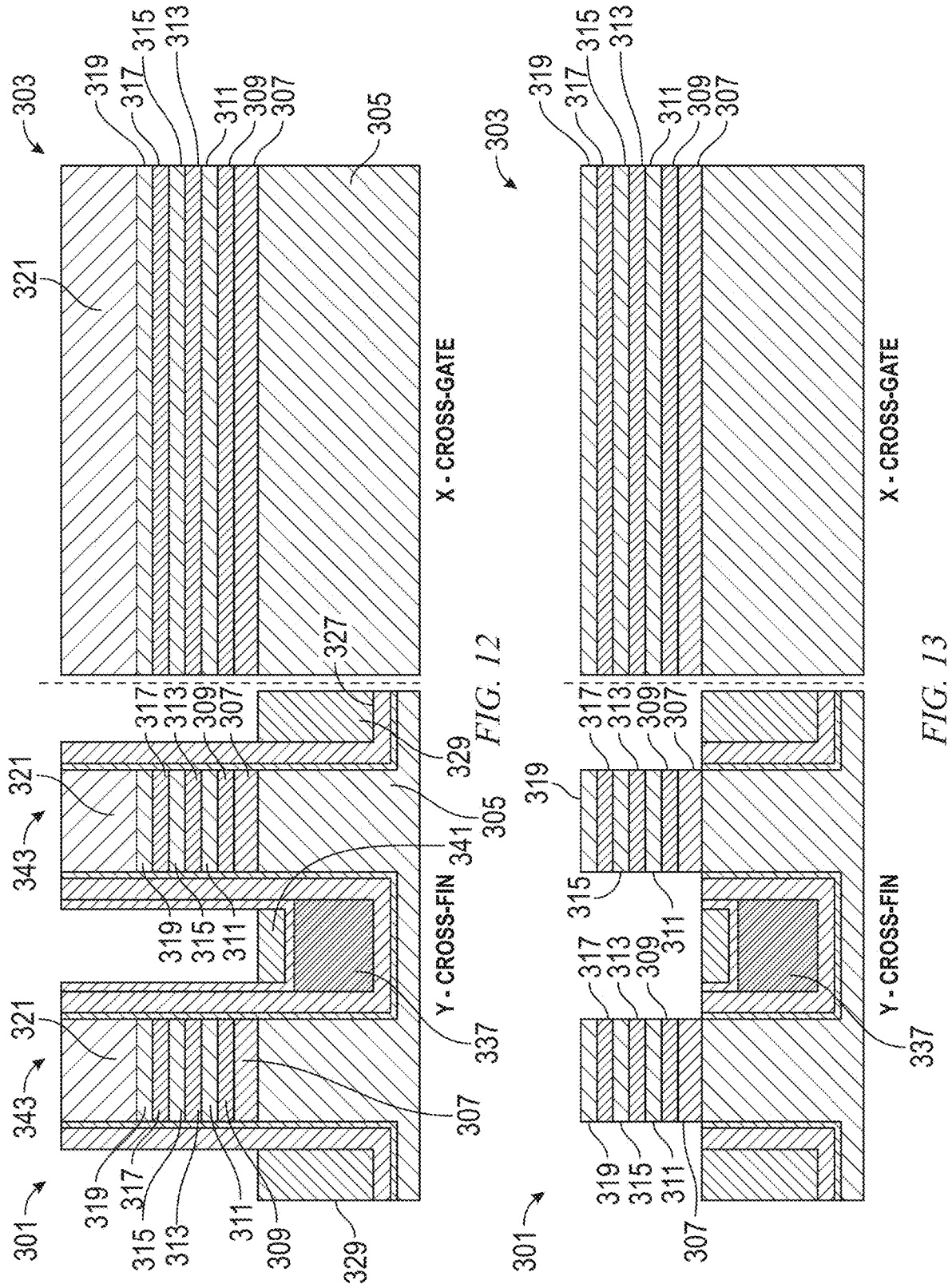
Figure 14:
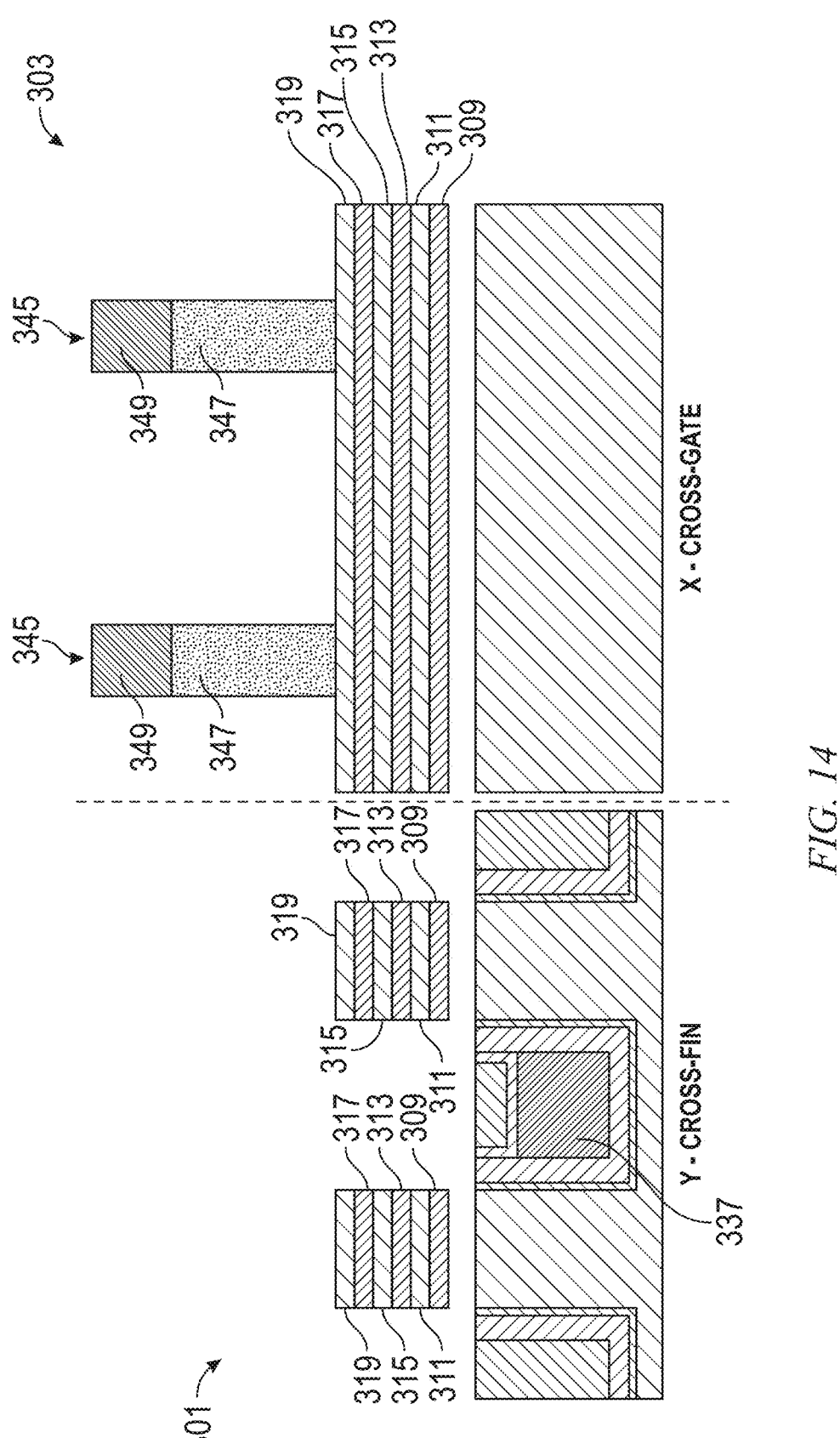

In FIG. 11, deposit shallow trench isolation oxide fill 341 (for example, via Furnace Chemical Vapor Deposition (FCVD)) and carry out chemical-mechanical polishing. In FIG. 12, recess via additional CMP and selective etch to reveal the fins 343. In FIG. 13, strip the liner and hard mask. In FIG. 14, form dummy gates 345 including amorphous silicon 347 and hard mask 349. Note also selective removal of the layer 307. In particular, deposit amorphous Si material 347 and carry out planarization; deposit gate hardmask material 349 (can be a multilayer dielectric); pattern the hardmask and etch the a-Si to form the dummy gates 345. Carry out selective removal of high-Ge % SiGe 307 selective to low-Ge % SiGe sheets 309, 313, 317, Si sheets 311, 315, 319, and dummy gates 345. For example, use a gas phase HCl process for this aspect. Although in the views of FIG. 14 it appears that after removal of the high-Ge % SiGe 307, the structure is "floating in the air"; this is not the case—the fins are anchored by the gates wrapping around them and the gates themselves are resting on STIs in the STI regions.

Figure 15:
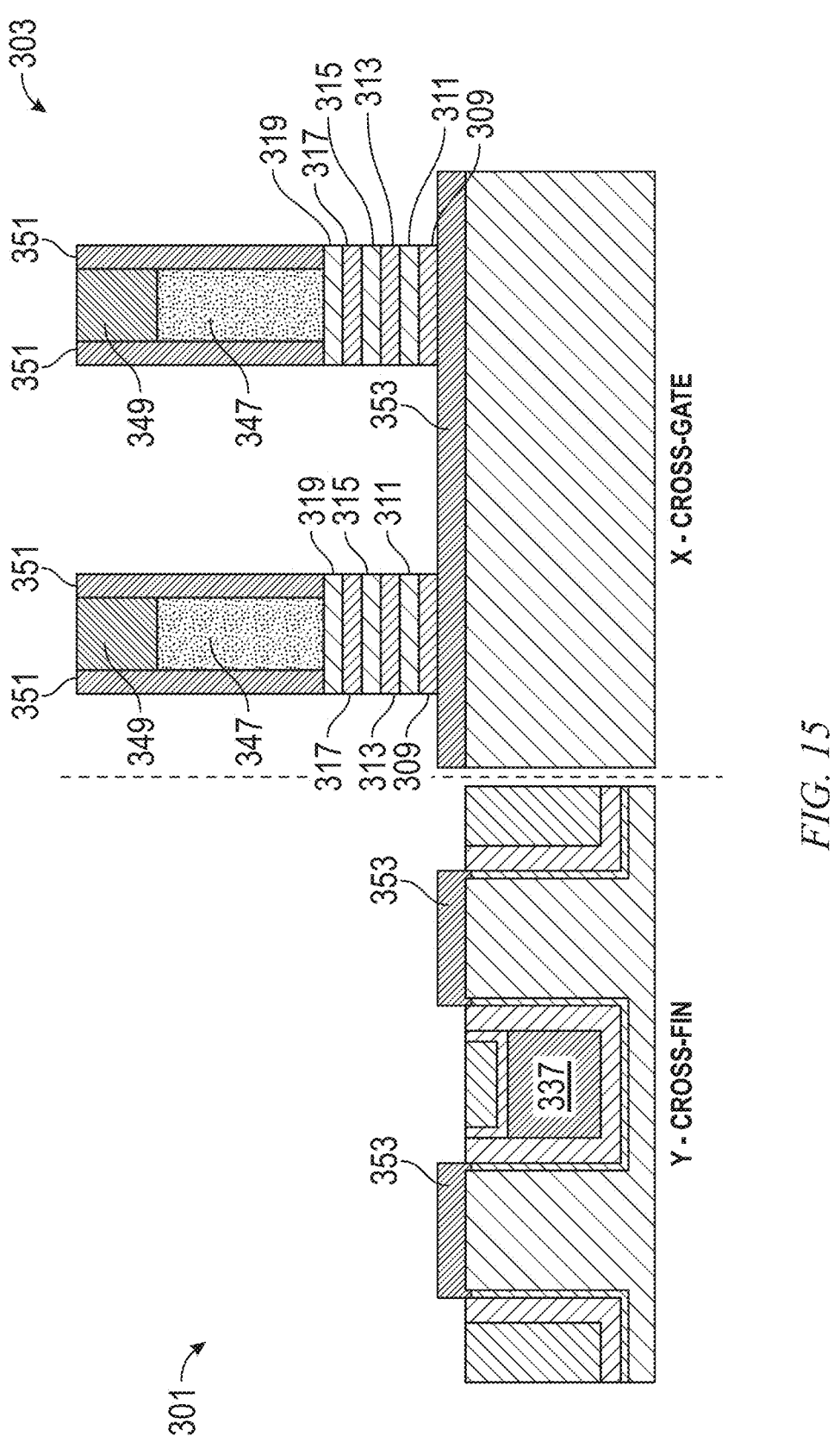
Figure 16:
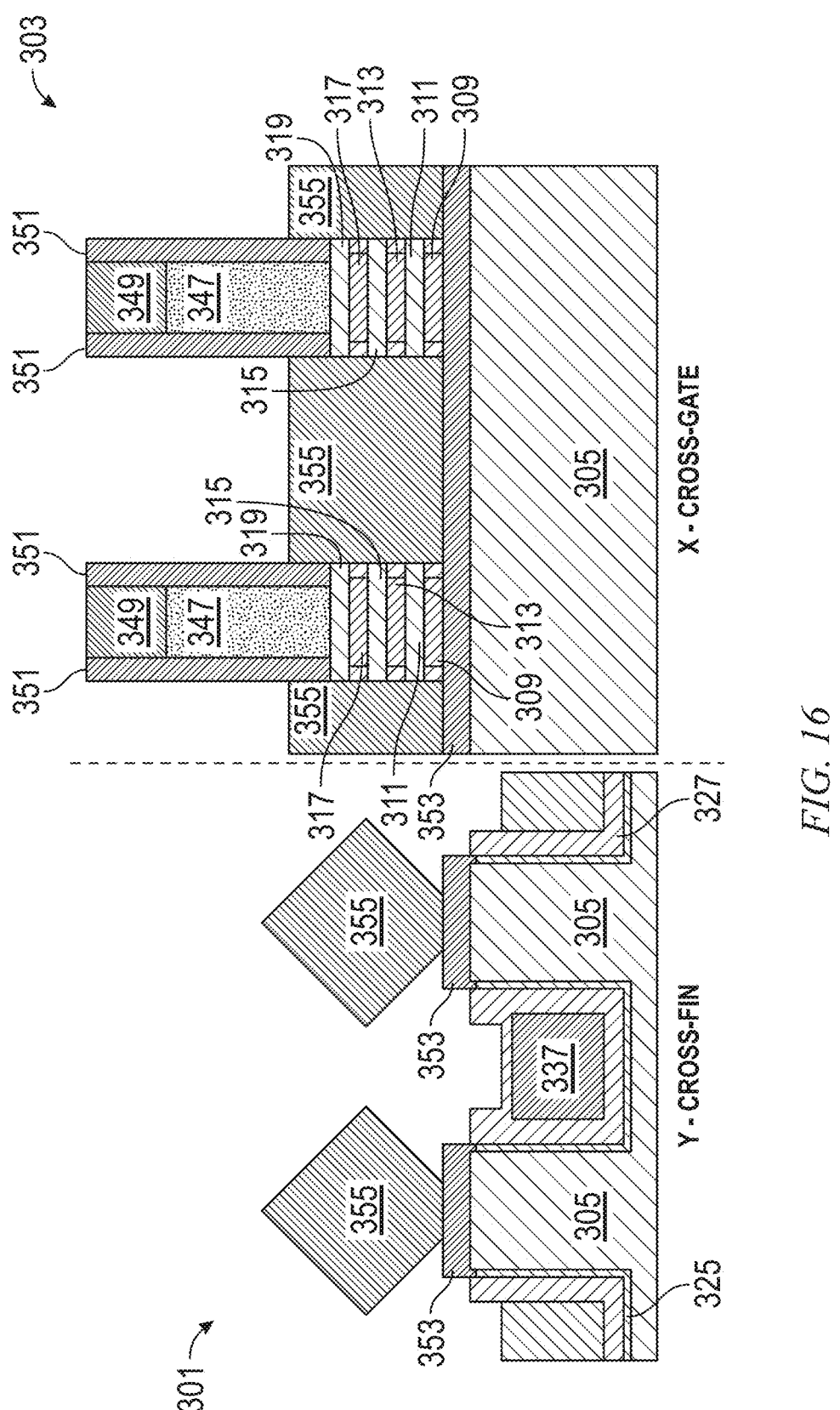
Figure 17:
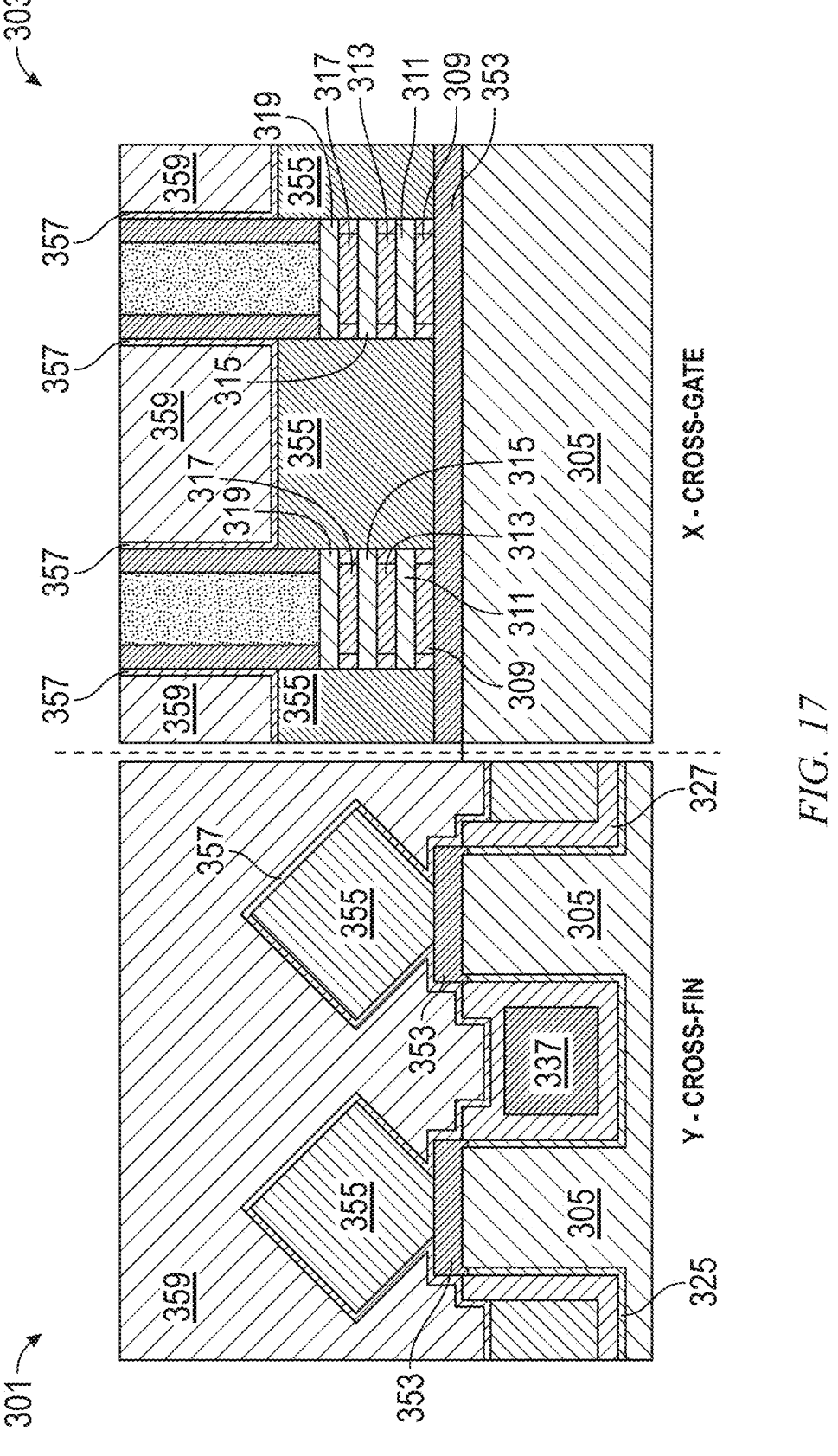
Figure 18:
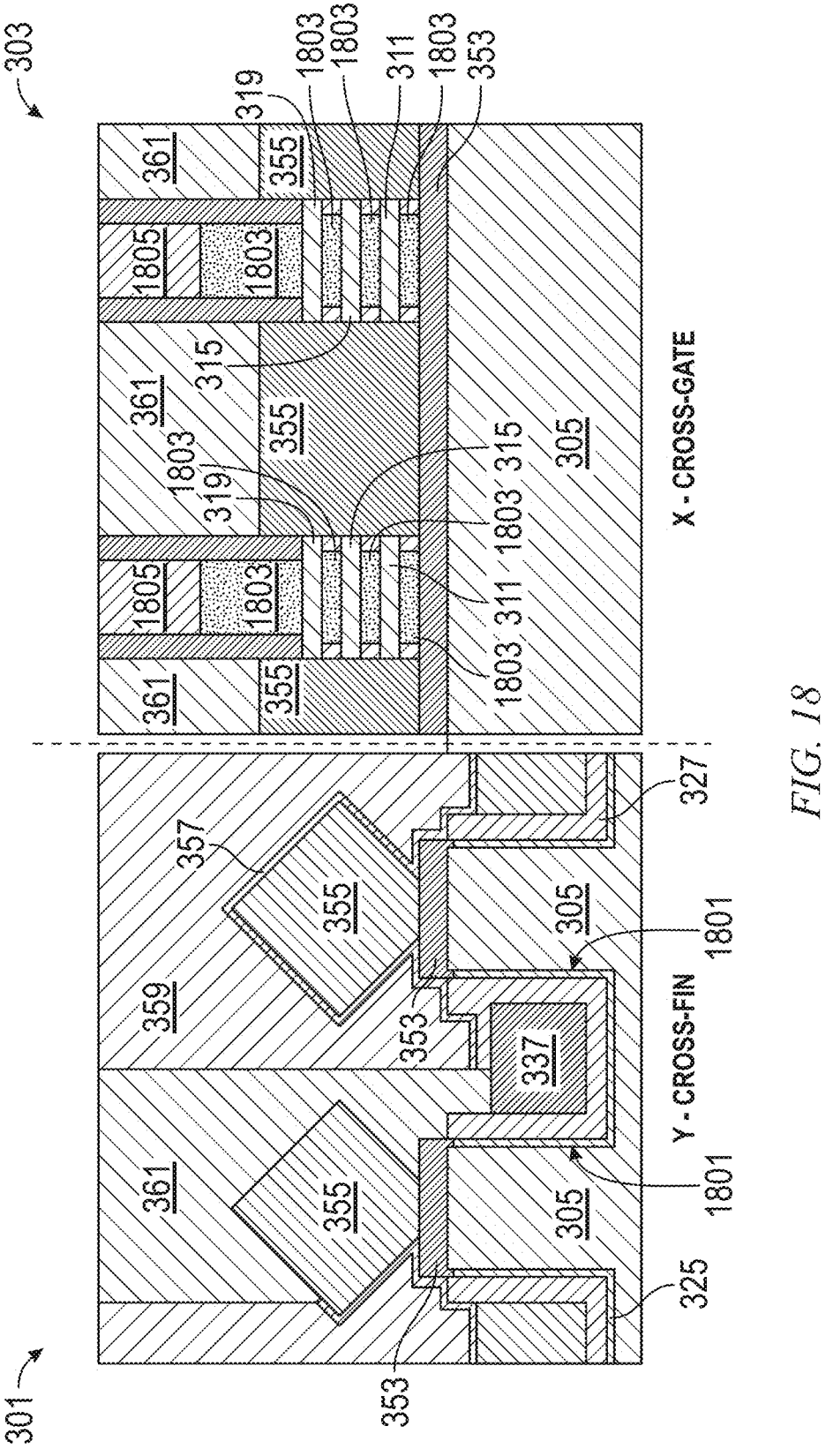
FIG. 18 shows an end result of the process of FIGS. 3-17 (plus additional steps)

In FIG. 15, simultaneously form the gate spacers 351 and bottom dielectric isolation (BDI) 353 and recess the fins by etching those portions of the layers 309-319 in the regions thereof not located under the dummy gates and spacers. More specifically, carry out conformal deposition of low-K dielectric material, simultaneously forming the gate spacers 351 and BDI 353; anisotropically etch the spacer, which removes the spacer material on horizontal surfaces; and anisotropically etch the fins, self-aligned to the gates and gate spacers, with a selective etch stop on the buried BDI layer. FIG. 16 shows dual epitaxial source-drain formation 355. In FIG. 17, deposit conformal Contact Etch-Stop liner (CESL) 357 (e.g. SiN) and inter-layer dielectric 359 (e.g. FCVD SiO$_2$), and carry out chemical-mechanical polishing. In FIG. 18, note the final structure including trench metal contact 361. To move from the structure of FIG. 17 to the final structure in FIG. 18, selectively remove the sacrificial a-Si gate 347 (numbered in FIG. 16); selectively remove sacrificial SiGe suspensions (portions of 309, 313, 317 remaining in FIG. 17); form conformal High-K metal gate stack 1803; recess the HKMG stack from the top of the gate; form self-aligned contact (SAC) caps 1805 over the HKMG; pattern and etch cavities for the trench metal contacts 361 in the ILD 359 and selectively remove CESL 357 in the 361 contact regions. Note that contact metal 361 can extend over the BPR 337 to contact it. Then, deposit trench metal contact 361 in the cavities and carry out CMP.

Figure 19:
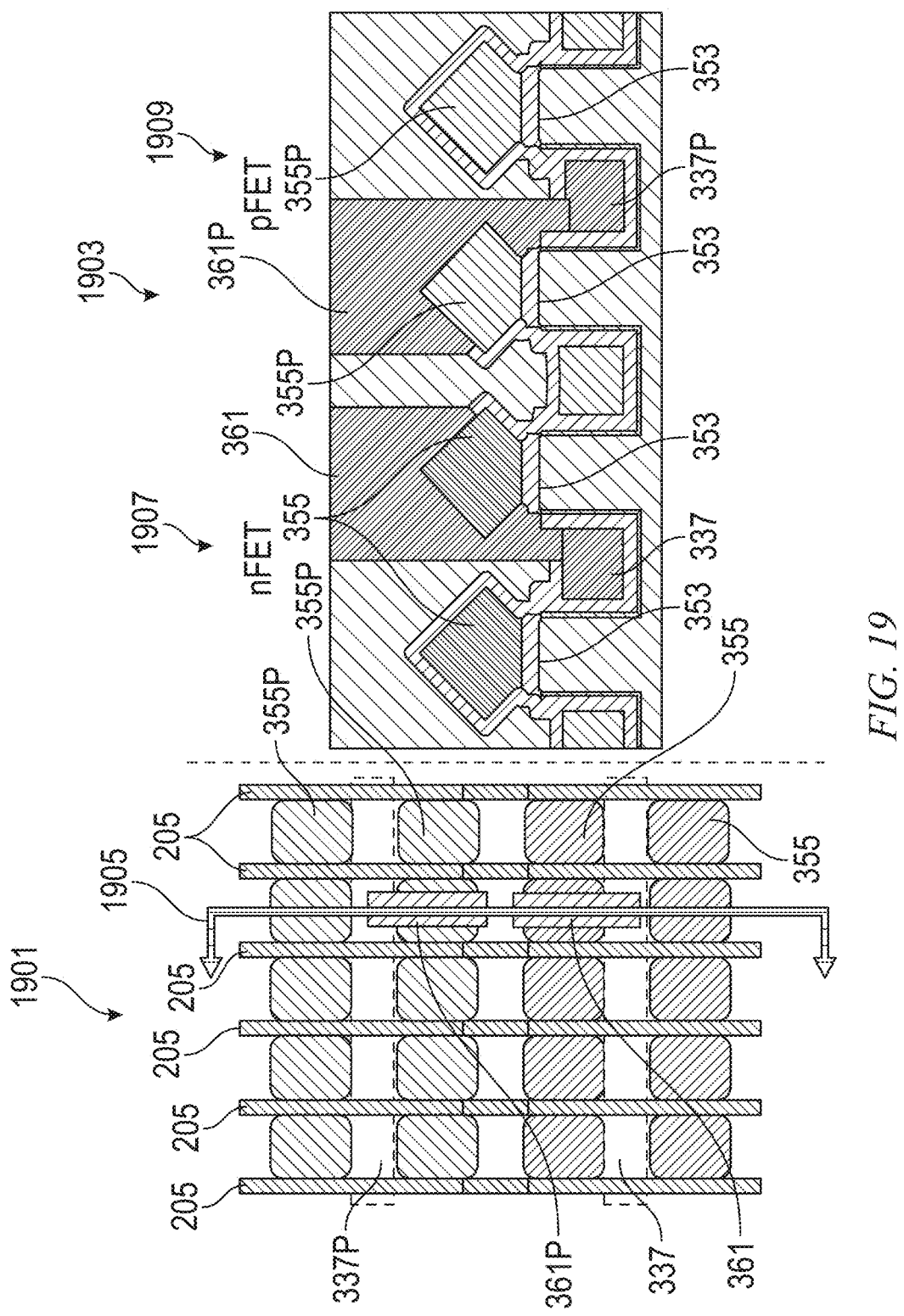
FIG. 19 shows the structure of FIG. 18 in the context of a larger circuit.

FIG. 19 shows the structure of FIG. 18 in the context of a larger circuit including a top view 1901 and a section 1903 along line 1905 looking to the left (i.e. line 1905 shows a cross-section of the "canyon" between the gates 205). Note NFET 1907 and PFET 1909. Note the epitaxially grown source-drain regions for the pFET are labeled 355P, the trench metal contact for the pFET is labeled 361P, and the BPR for the pFET is labeled 337P. Note also gates 205.

For clarity, note that each source/drain region shown on the right-hand side of FIG. 19 corresponds to a different device running in the perpendicular direction (into and out of the page), as seen in the top view on the left-hand side. In the right-hand "X" view 303 of FIG. 18, note a given transistor's Source-Gate-Drain. In the left-hand Y-view 301 of FIG. 18, note the BPR running in-between two adjacent devices.

Figure 20:
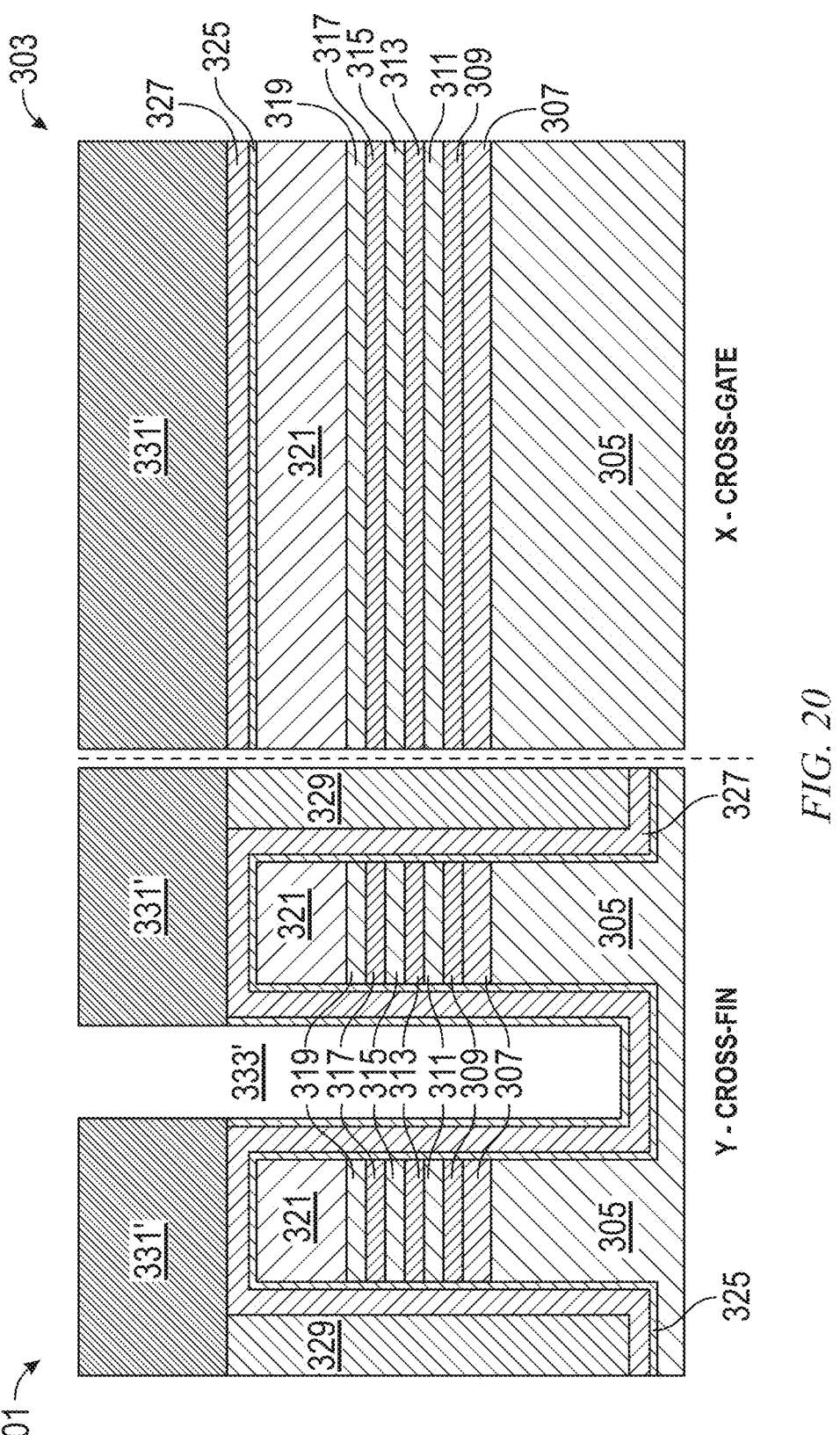
FIGS. 20-29 show exemplary fabrication steps for a second embodiment.
Figure 21:
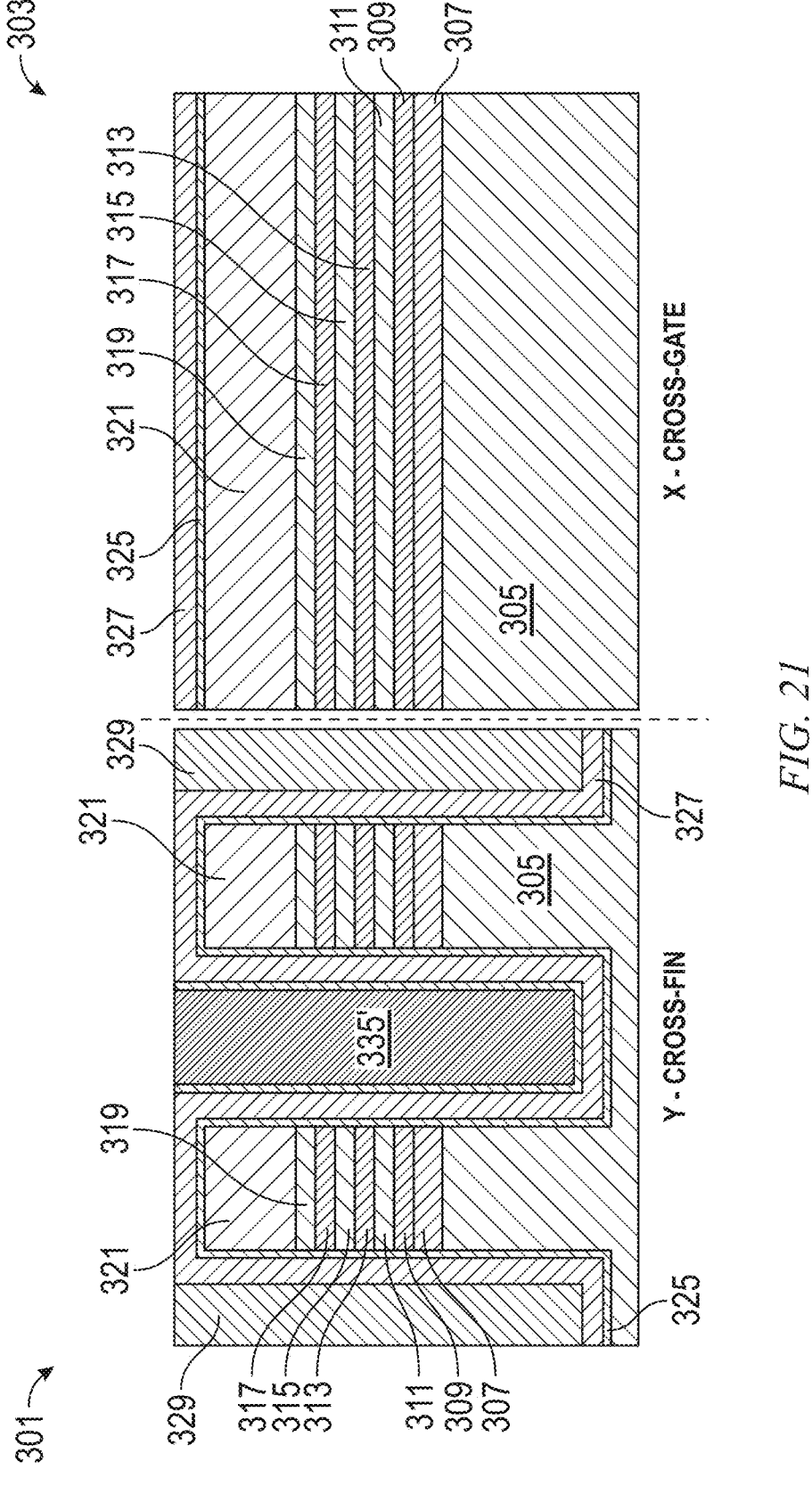
Figure 22:
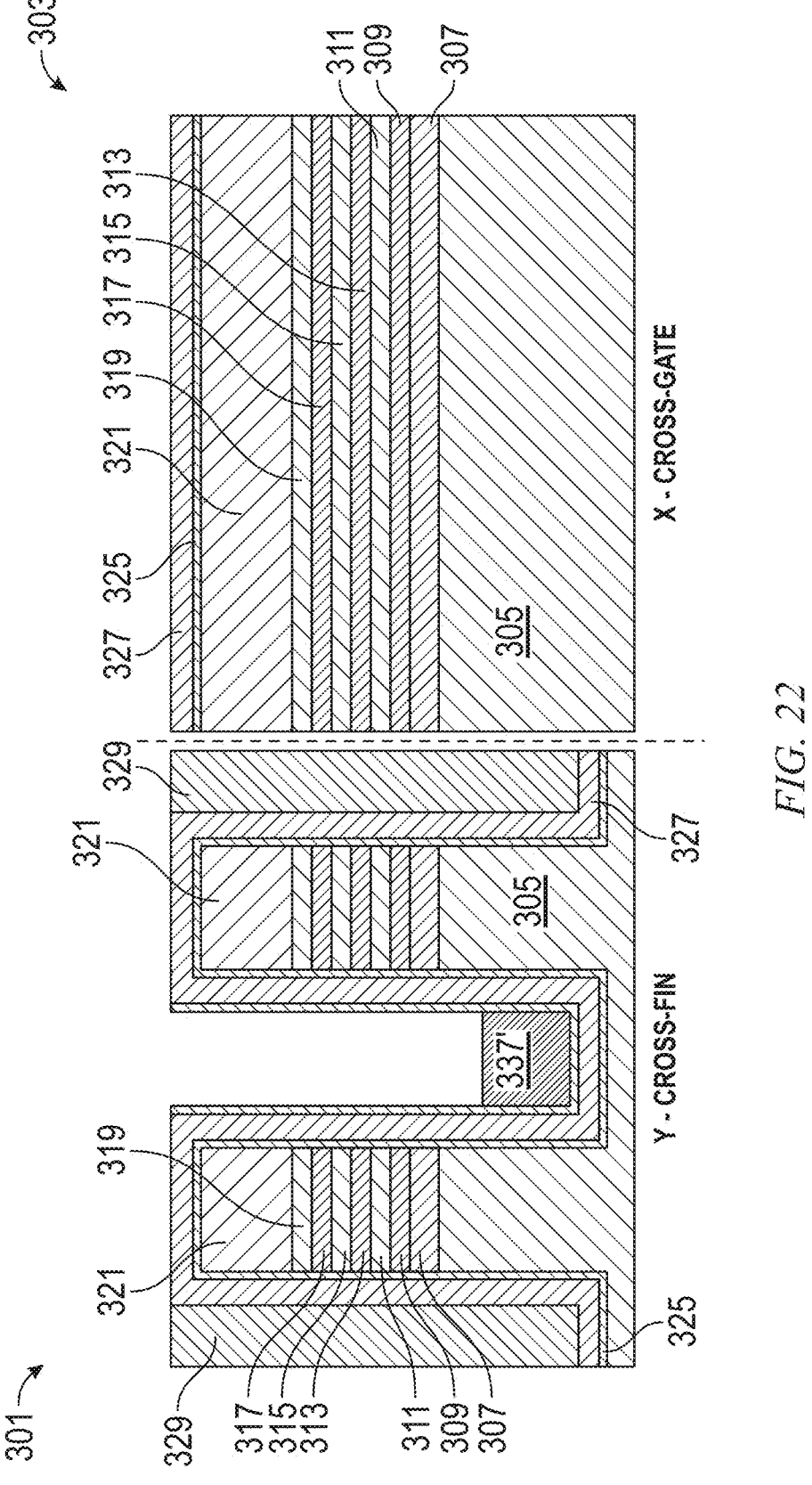

Consider now a second exemplary process flow for an exemplary embodiment of nanosheet transistors with buried power rails and an air gap liner. Initial steps are similar to FIGS. 2-6; the intermediate structure of FIG. 6 can be taken as a starting point except that the silicon nitride layer 327 can be unitary SiN as in the earlier example or can be a bi-layer structure including, for example, SiN and SiO. In FIG. 20, deposit and pattern an organic dielectric layer (ODL) 331' and note that in this example, the openings are slightly narrower than in FIG. 7. Using a suitable etchant, anisotropically recess the shallow trench isolation (STI) oxide 329 to create a region 333' which is correspondingly narrower than in the first embodiment, and note some STI oxide 329 remaining on the walls of region 333'. In FIG. 21, strip the ODL layer 331', deposit (overfill) buried power rail metal 335' (e.g., cobalt or the like) and carry out CMP on the BPR metal. In FIG. 22, recess the BPR metal 335' with a suitable etchant to obtain rail 337'.

Figure 23:
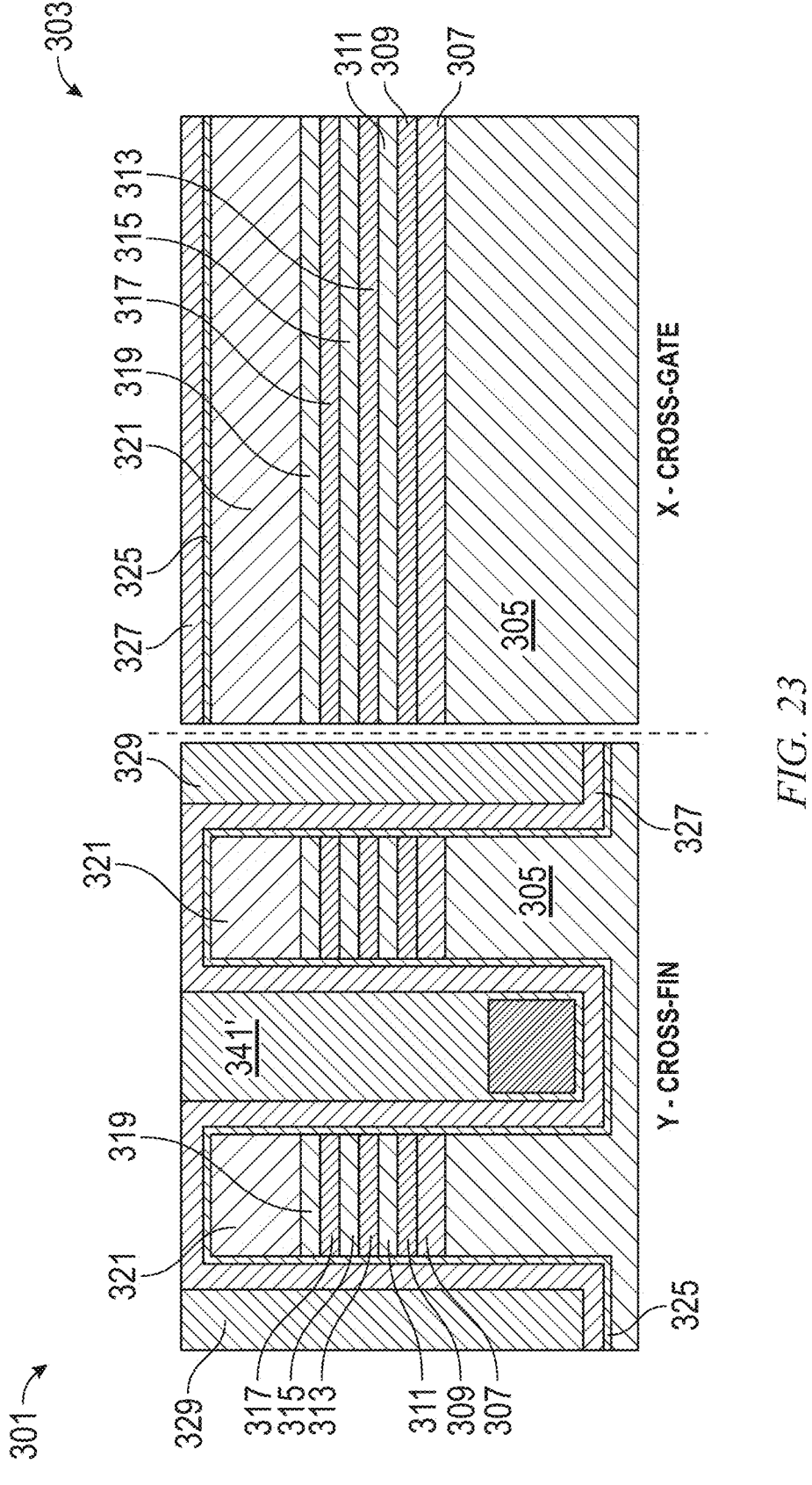
Figure 24:
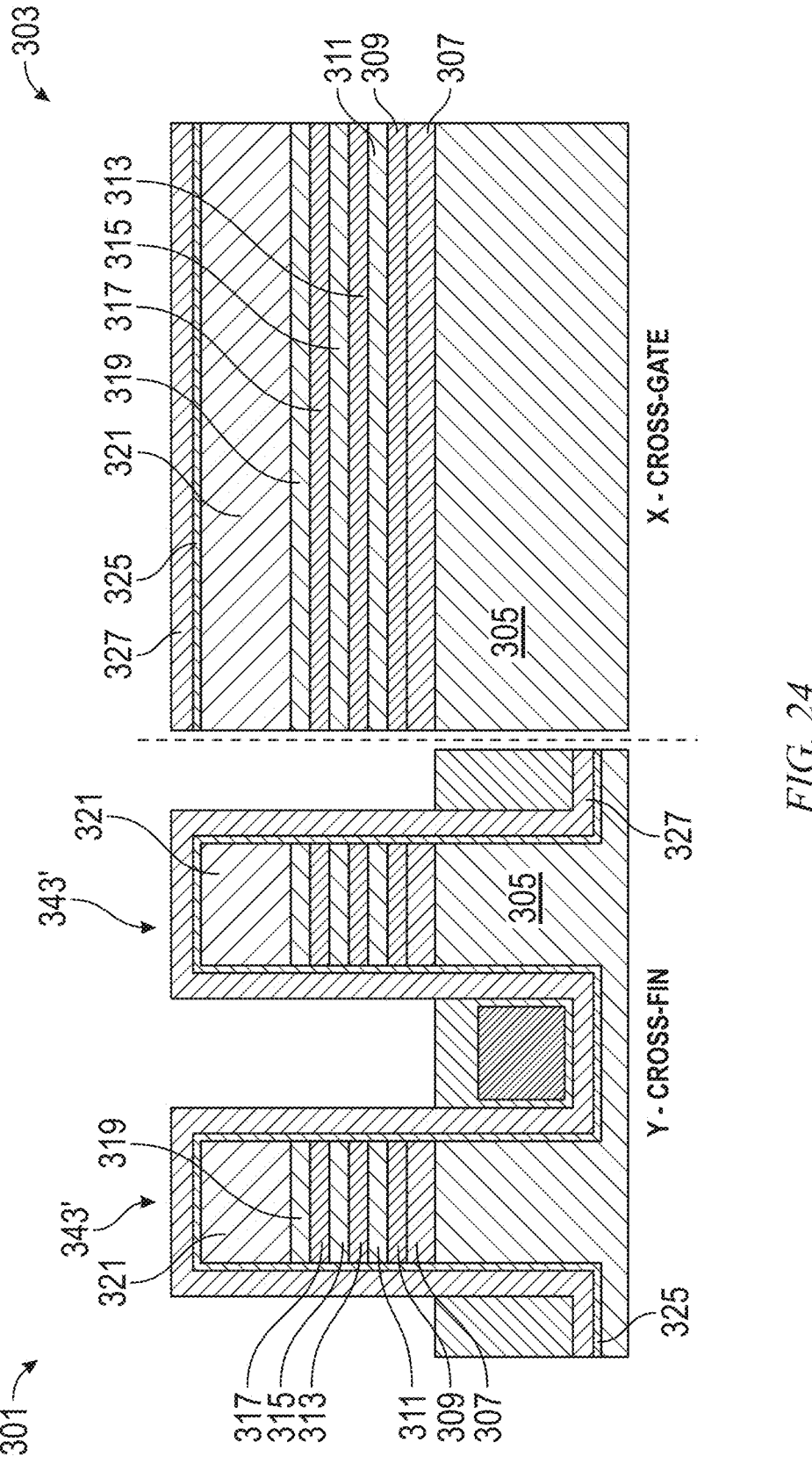
Figure 25:
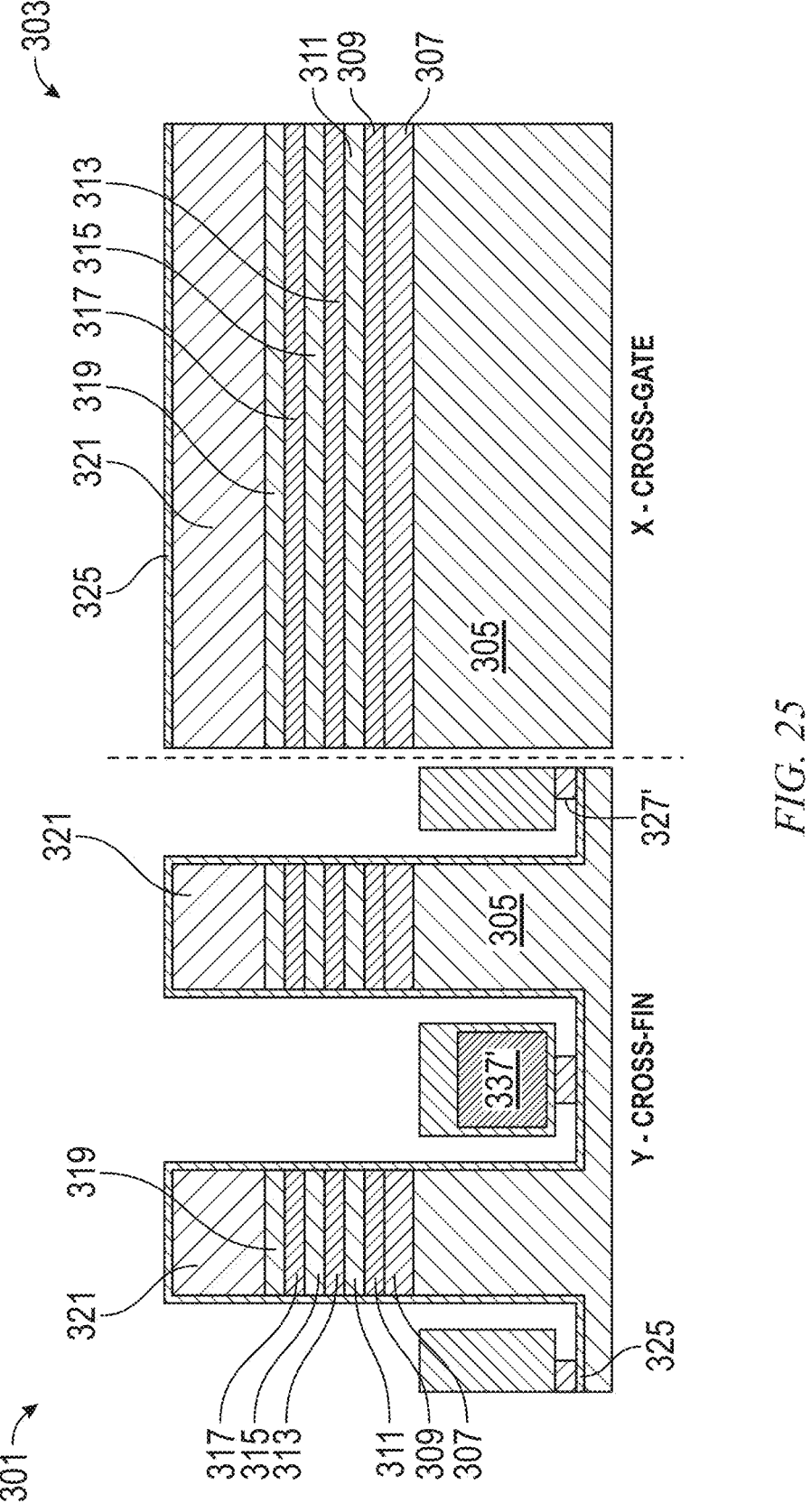
Figures 26, 27:
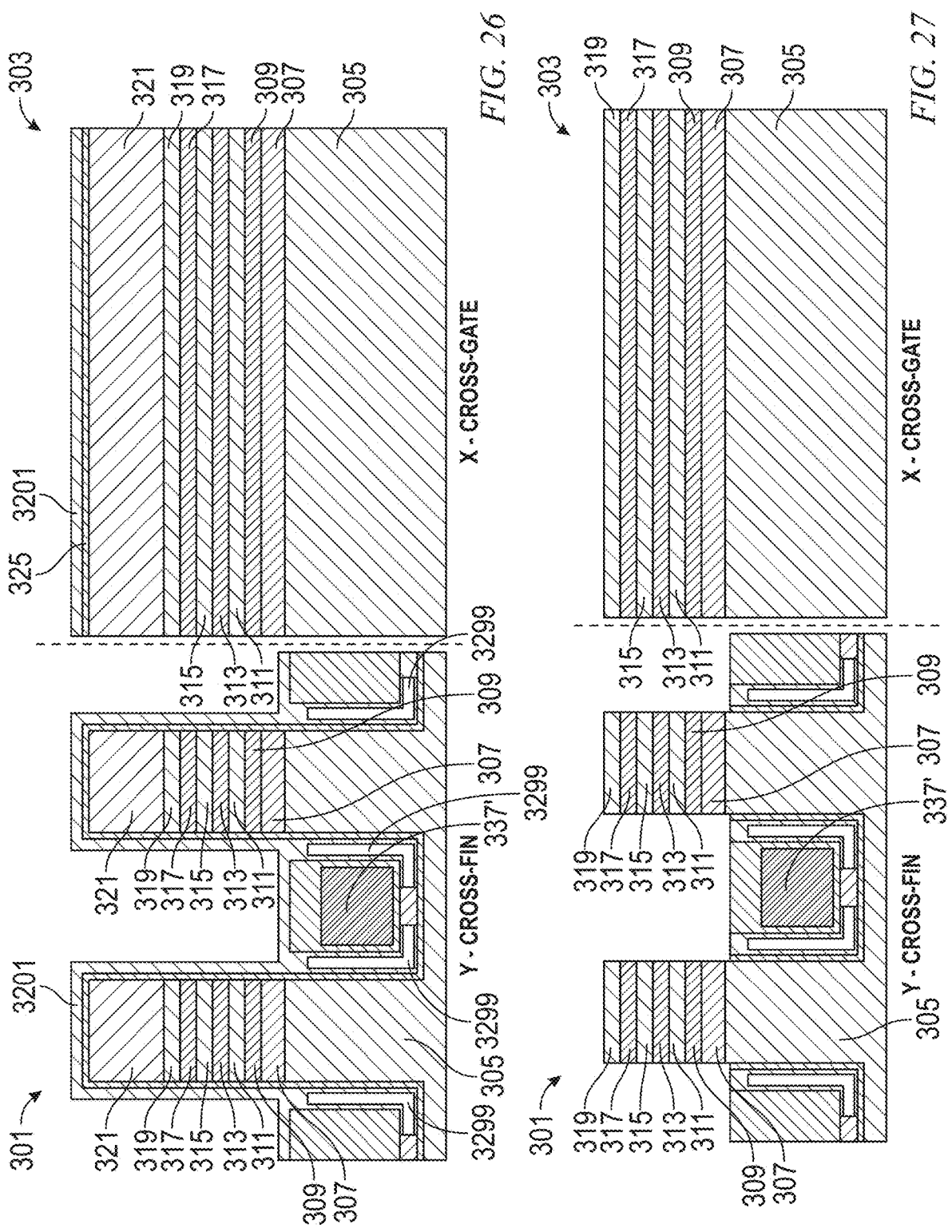
Figure 28:
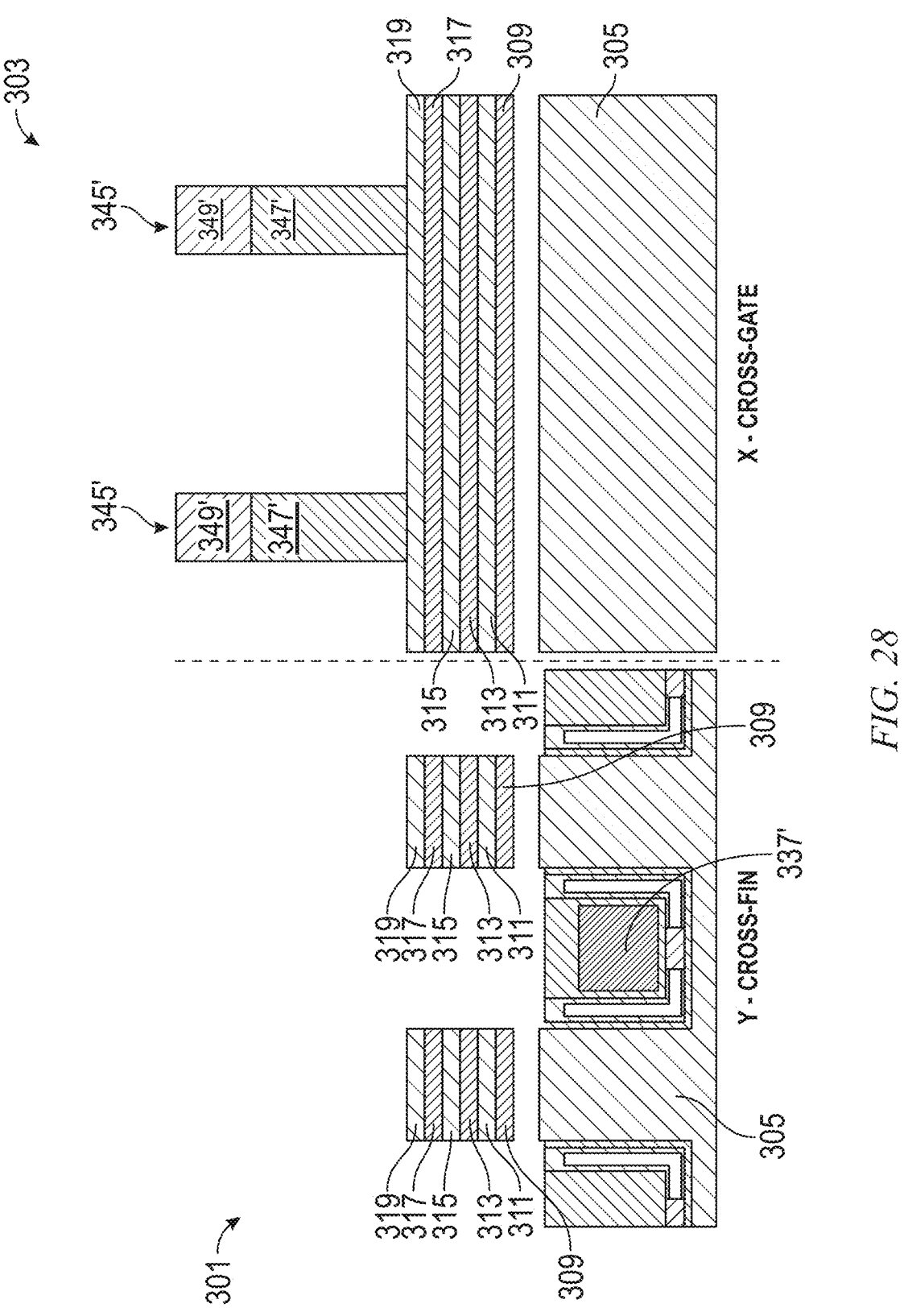

In FIG. 23, deposit shallow trench isolation oxide fill (e.g., SiO) 341' and carry out chemical-mechanical polishing. In FIG. 24, etch to reveal the fins 343'. In FIG. 25, over-etch the SiN liner (etched liner now designated 327') such that the BPR 337' surrounded by STI is on a small "pedestal" of remaining liner material. In FIG. 26, deposit a conformal Low-K liner 3201 (e.g., silicon borocarbonitride (SiBCN)). Note air gap 3299. In FIG. 27, etch back the Low-K liner, etch the SiO 325 and strip the hard mask. In FIG. 28, form dummy gates 345' including amorphous silicon 347' and hard mask 349'. Note also selective removal of the layer 307. In particular, deposit amorphous Si material 347' and carry out planarization; deposit gate hardmask material 349' (can be a multilayer dielectric); pattern the hardmask and etch the a-Si to form the dummy gates 345'. Carry out selective removal of high-Ge % SiGe 307 selective to low-Ge % SiGe sheets 309, 313, 317, Si sheets 311, 315, 319, and dummy gates 345'. For example, use a gas phase HCl process for this aspect. Although in the views of FIG. 28 it appears that after removal of the high-Ge % SiGe 307, the structure is "floating in the air"; this is not the case—the fins are anchored by the gates wrapping around them and the gates themselves are resting on STIs in the STI regions.

Figure 29:
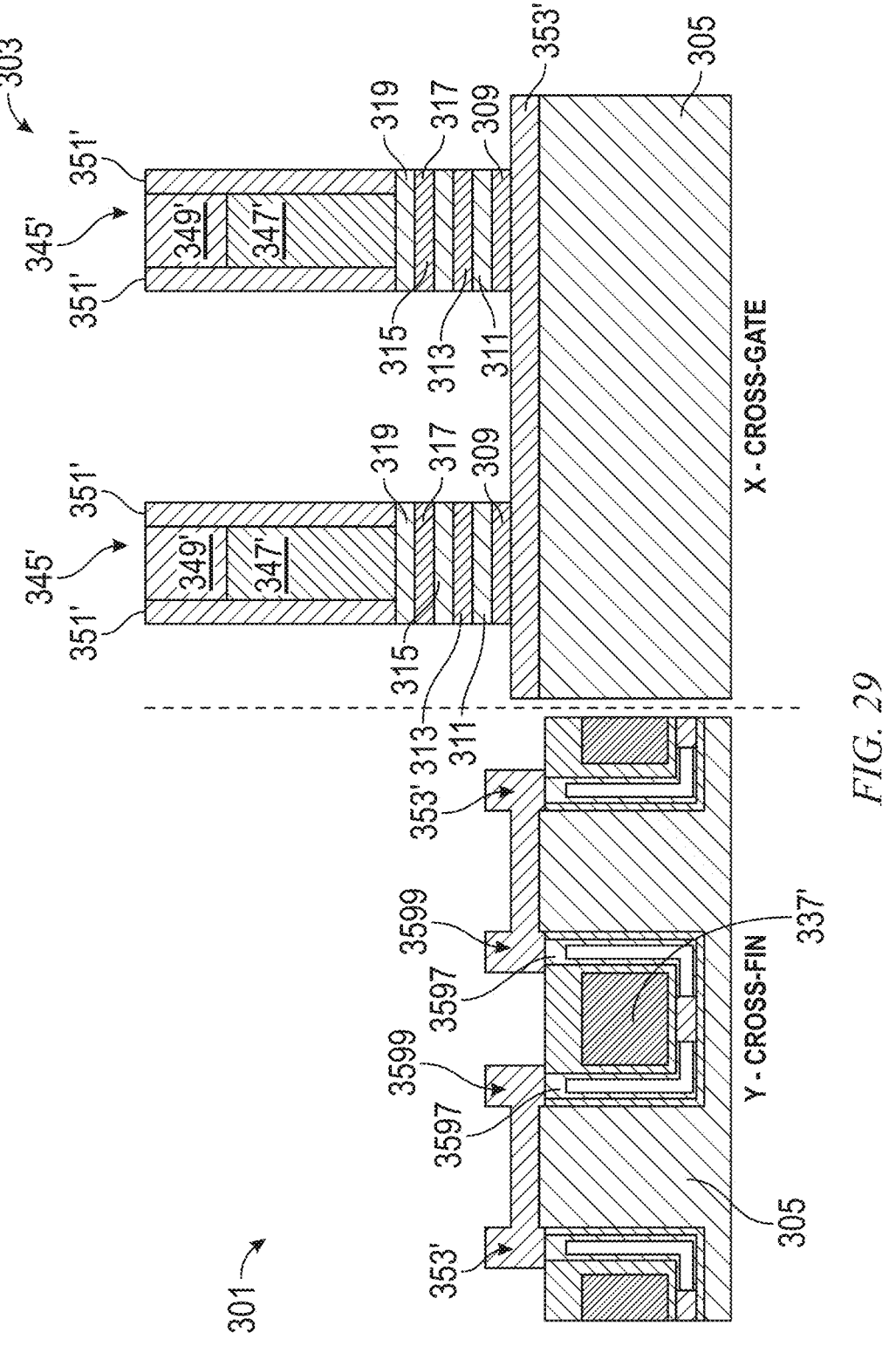

In FIG. 29, simultaneously form the gate spacers 351' and bottom dielectric isolation (BDI) 353' and recess the fins 345' by etching those portions of the layers 309-319 in the regions thereof not located under the dummy gates and spacers. Note at 3599 how the fin sidewall spacer protects the air gap pinch-off region 3597. More specifically, carry out conformal deposition of low-K dielectric material, simultaneously forming the gate spacers 351' and BDI 353'; anisotropically etch the spacer, which removes the spacer material on horizontal surfaces; and anisotropically etch the fins, self-aligned to the gates and gate spacers, with a selective etch stop on the buried BDI layer.

Figure 30:
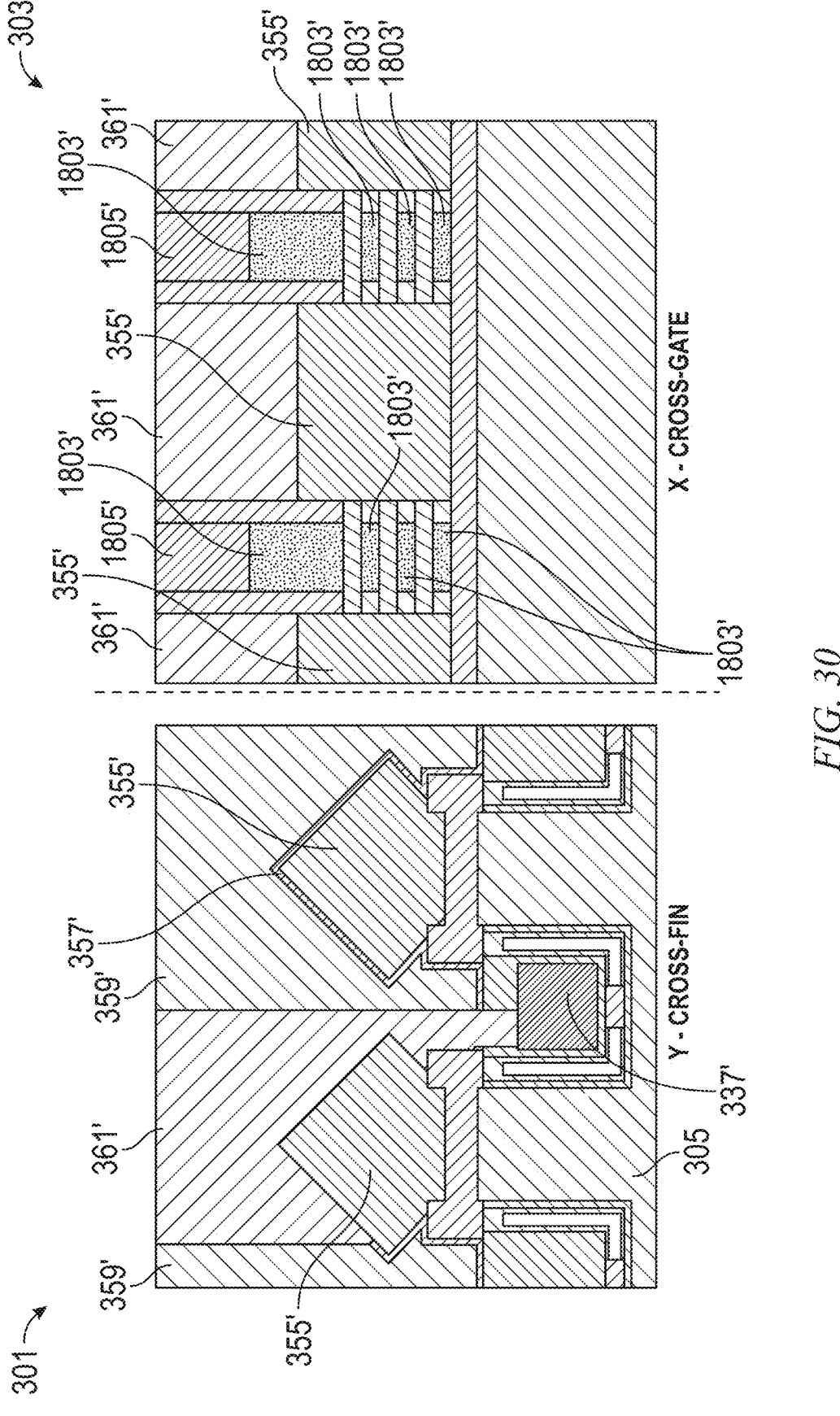
FIG. 30 shows an end result of the process of FIGS. 20-29 (plus additional steps)

FIG. 30 shows the final structure after epitaxial growth of the source-drain regions, POC (poly-silicon open CMP), High-k metal gate (HKMG) formation, and formation of trench contacts 361'. More specifically, form source-drain epitaxy 355'; deposit CESL 357'; deposit ILD 359' and CMP; selectively remove the sacrificial a-Si gate 347'; selectively remove the sacrificial SiGe suspensions (portions of 309, 313, 317 remaining in FIG. 29); and form a conformal high-K metal gate stack 1803'. Further, recess the HKMG stack from the top of the gate, form a self-aligned contact (SAC) cap 1805' over the HKMG; pattern and etch cavities for the trench metal contacts 361' in the ILD 359' and selectively remove the CESL 357' in the 361' contact regions. Note that metal 361' can extend over the BPR to contact it. Deposit trench metal contact 361' and carry out CMP.

Figure 31:
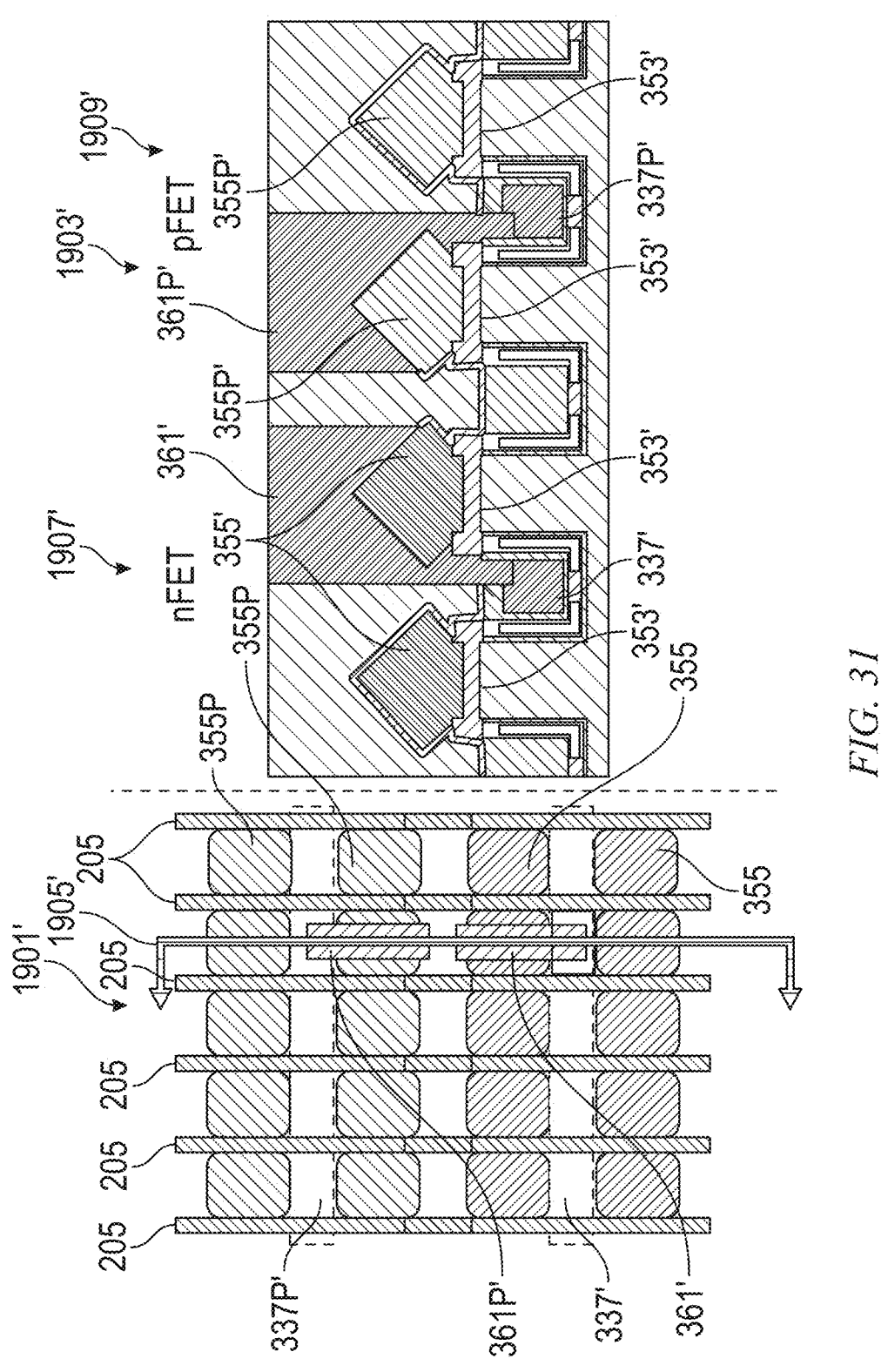
FIG. 31 shows the structure of FIG. 37 in the context of a larger circuit.

FIG. 31 shows the structure of FIG. 30 in the context of a larger circuit including a top view 1901' and a section 1903' along line 1905' looking to the left (i.e. line 1905' shows a cross-section of the "canyon" between the gates 205). Note NFET 1907' and PFET 1909'. Note the epitaxially grown source-drain regions for the pFET are labeled 355P', the trench metal contact for the pFET is labeled 361P', and the BPR for the pFET is labeled 337P'. Note also gates 205.

Figure 32:
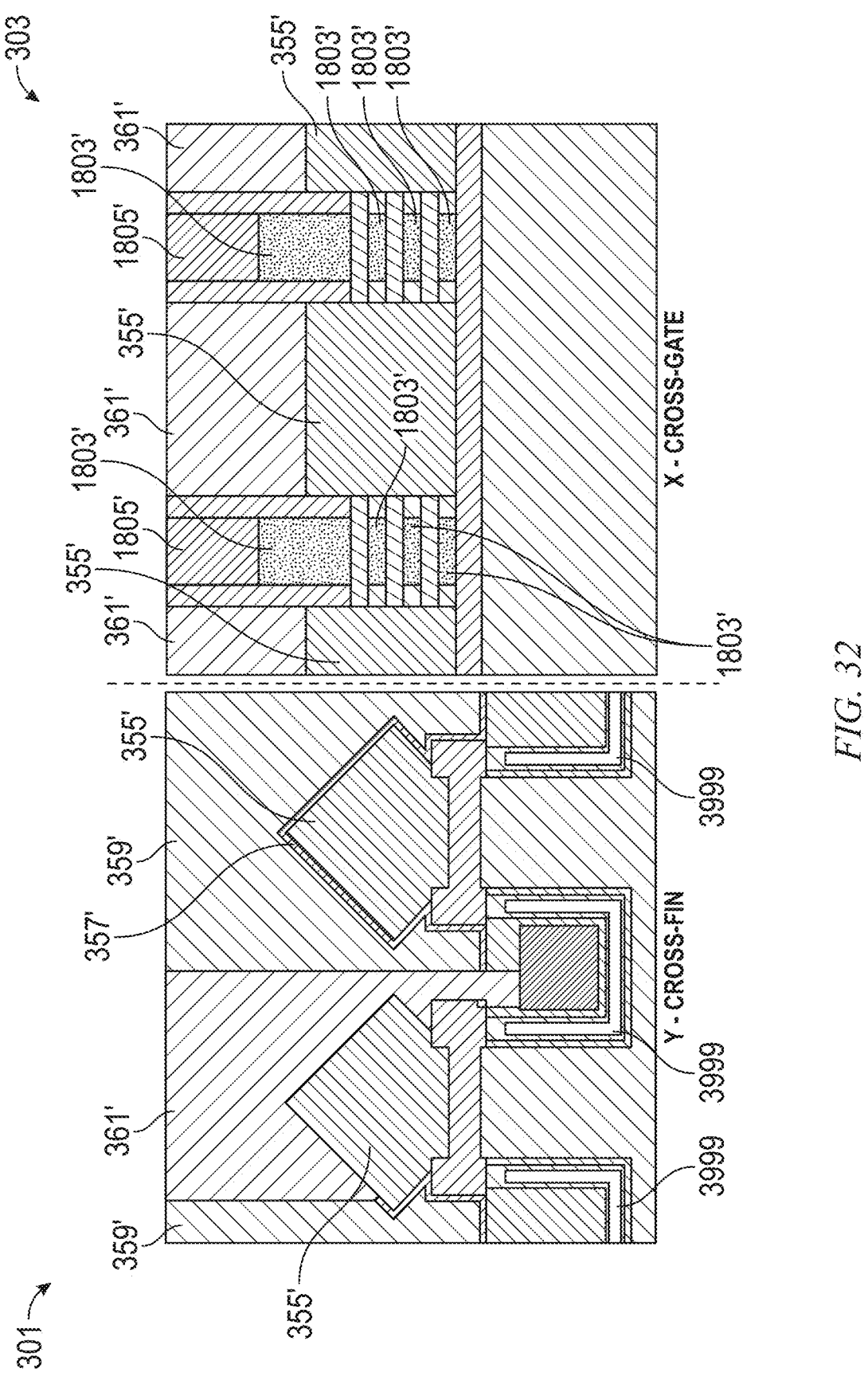
FIGS. 32 and 33 show alternatives to the structure of FIG. 30.
Figure 33:
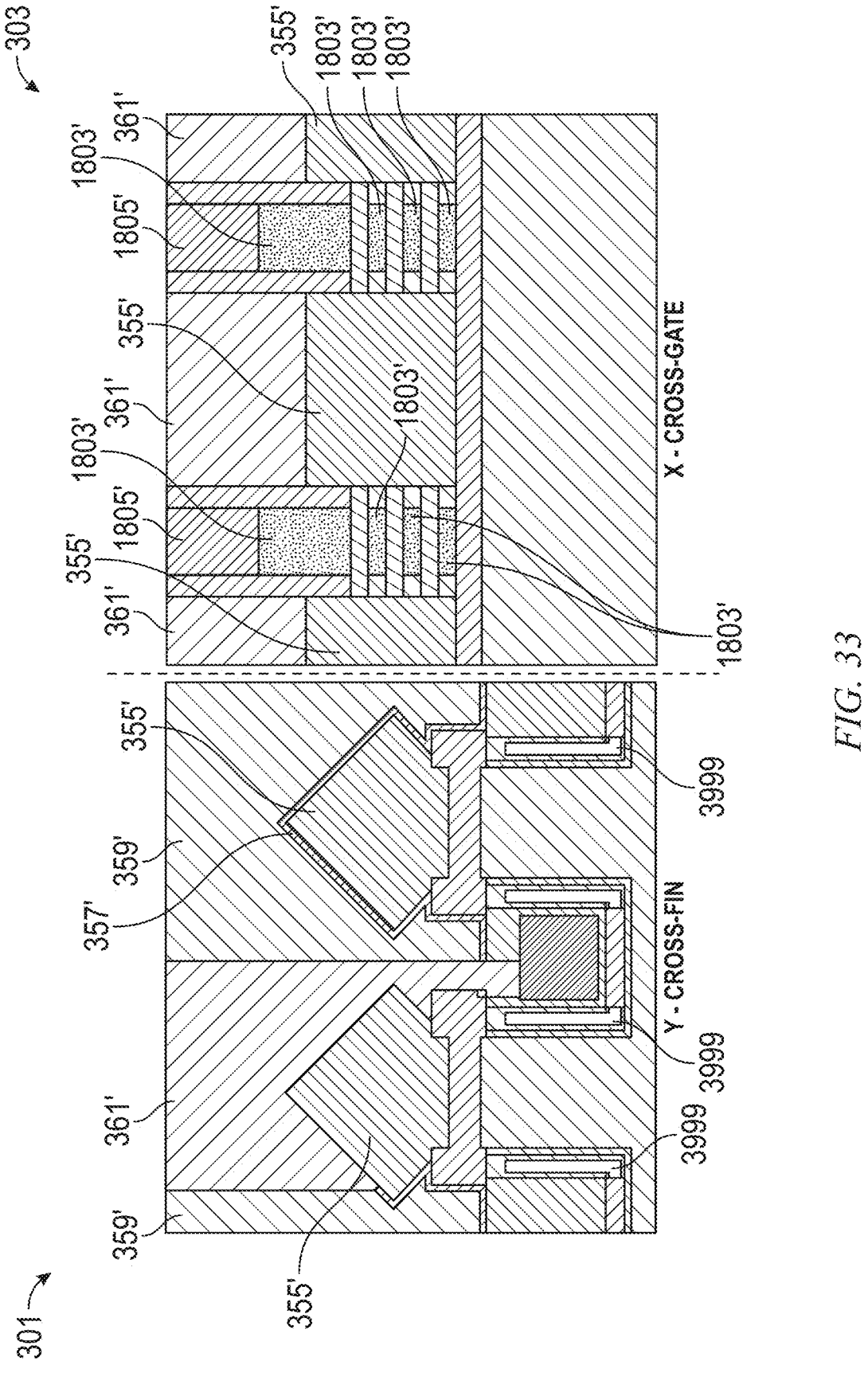

FIG. 32 shows an alternative to FIG. 30 with an all-around air gap 3999 formed by fully etching the SiN liner 327' in FIG. 25 (in the case of the all-around gap, the BPR is still supported out of the plane of the figure). FIG. 33 shows an alternative to FIG. 30 with an air gap variation for a shallower liner recess formed by reduced etching of the SiN liner 327' in FIG. 25.

Figure 34:
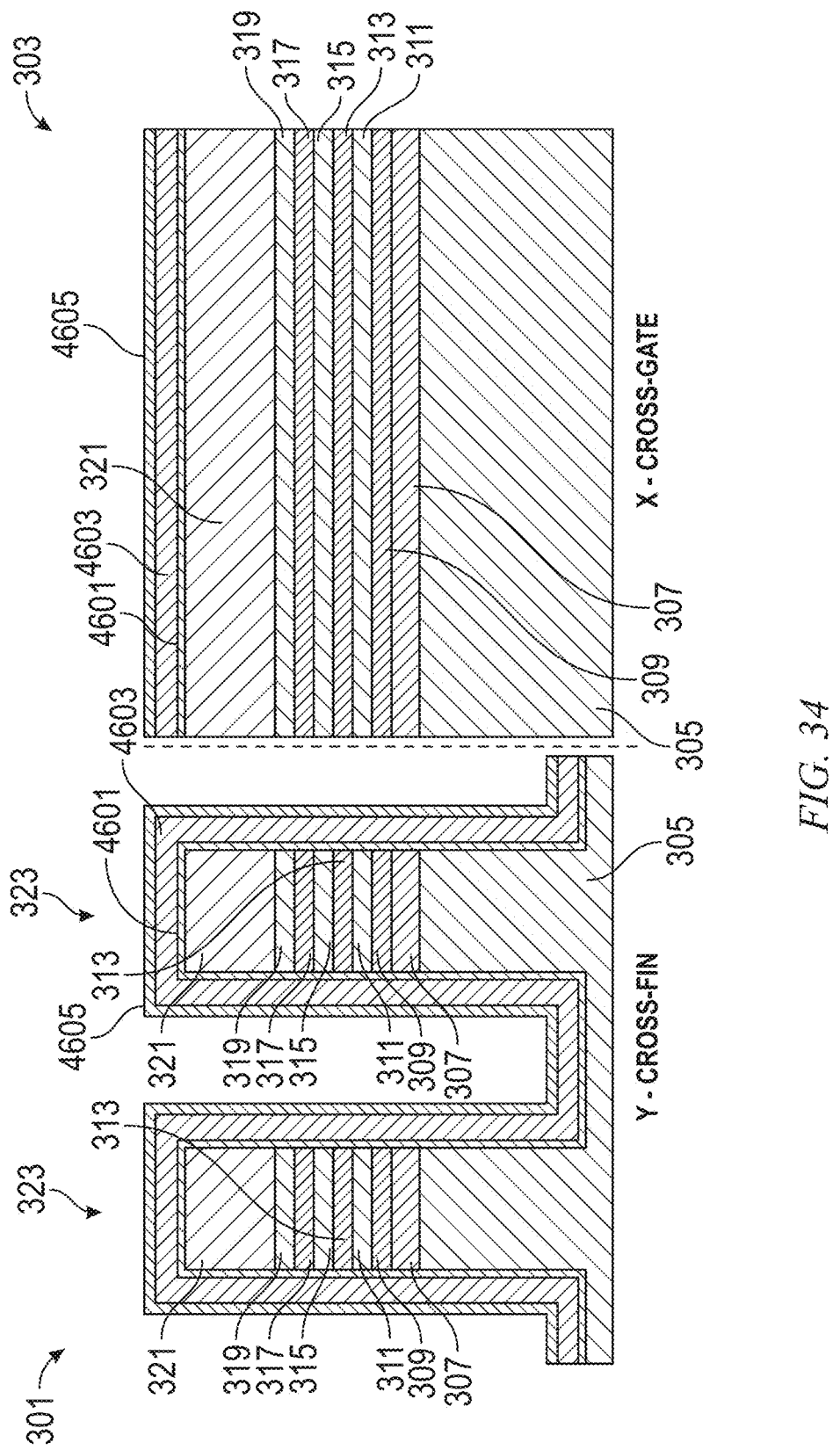
FIGS. 34-44 show exemplary fabrication steps for a third embodiment.
Figure 35:
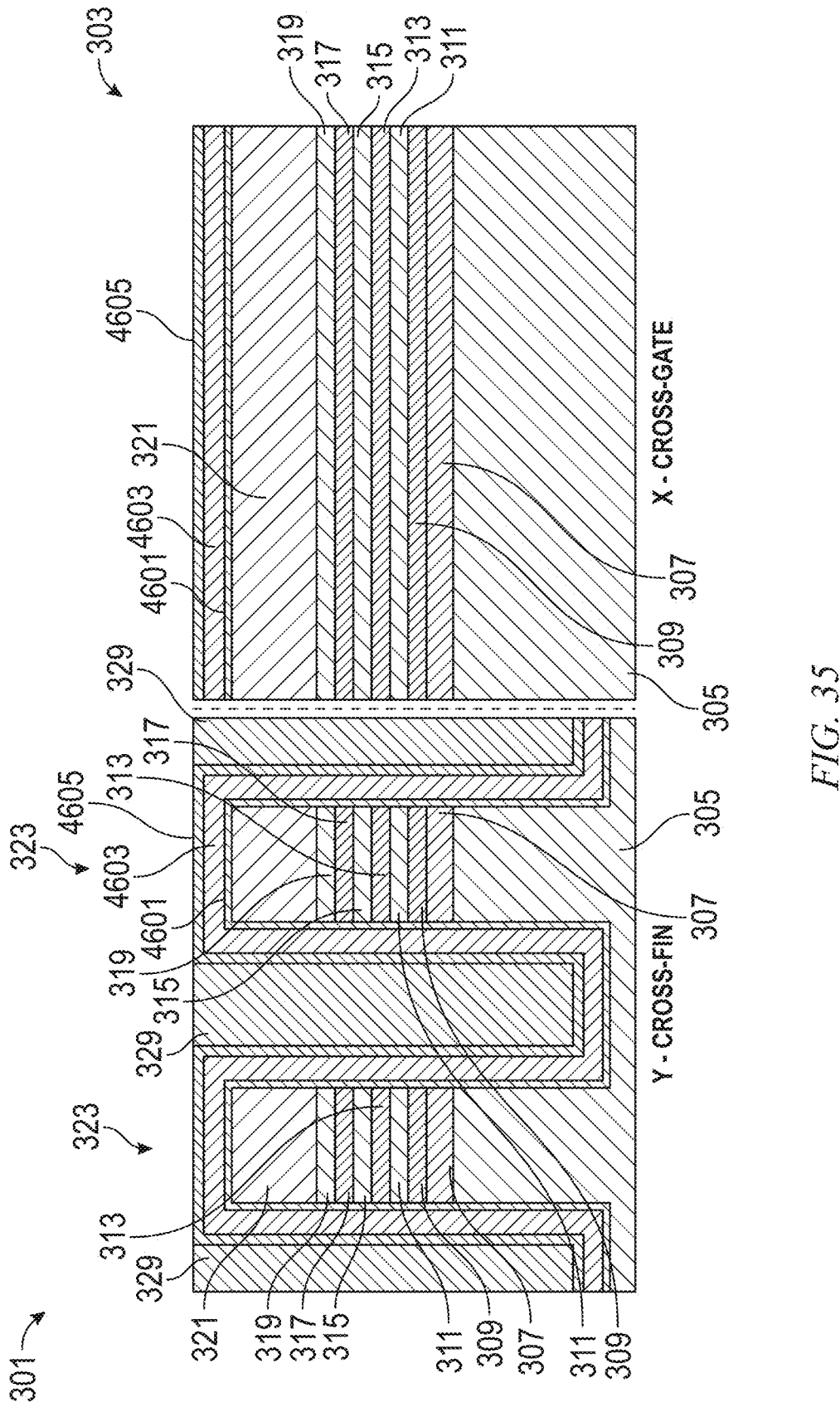
Figure 36:
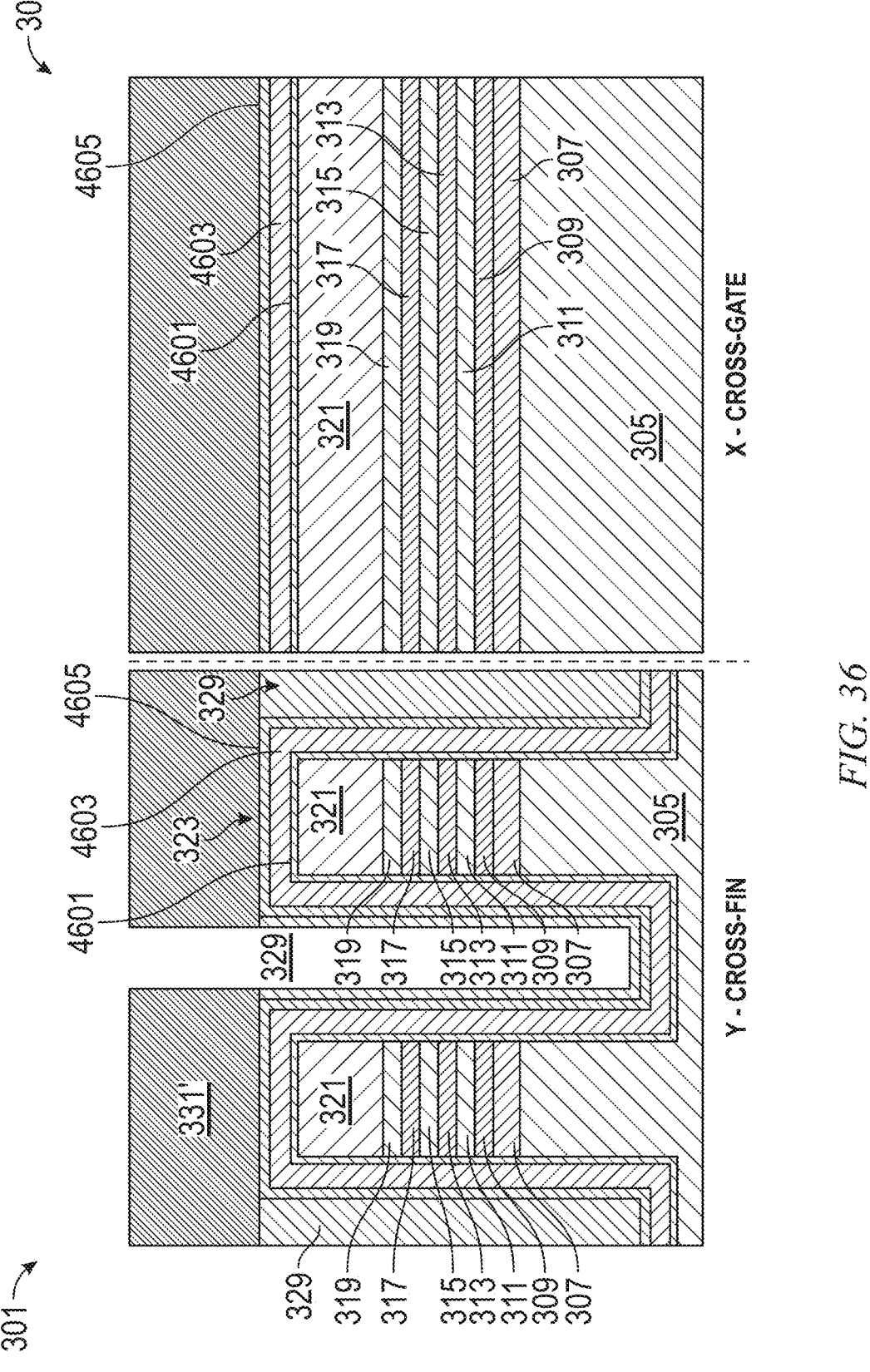
Figure 37:
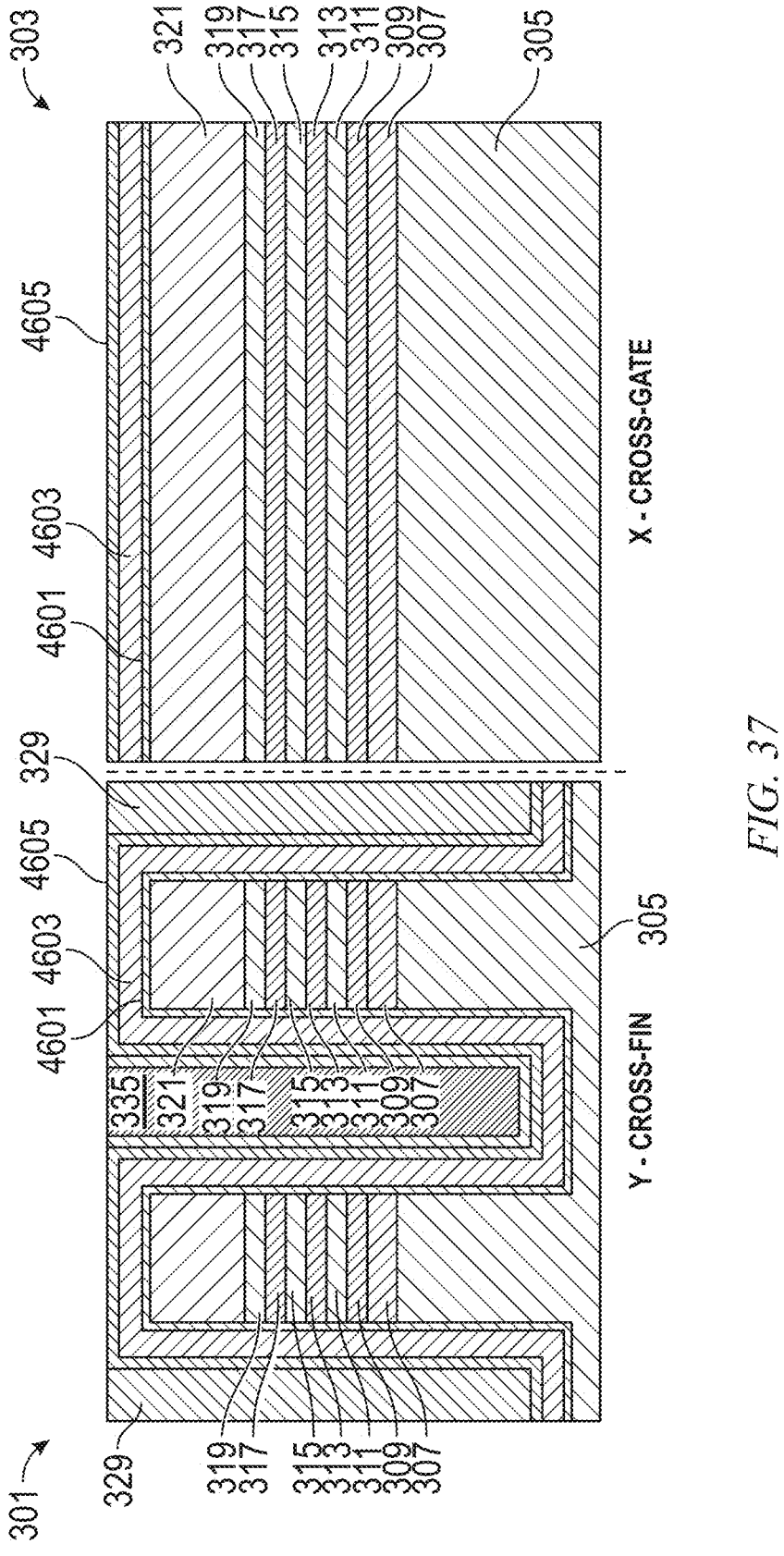
Figure 38:
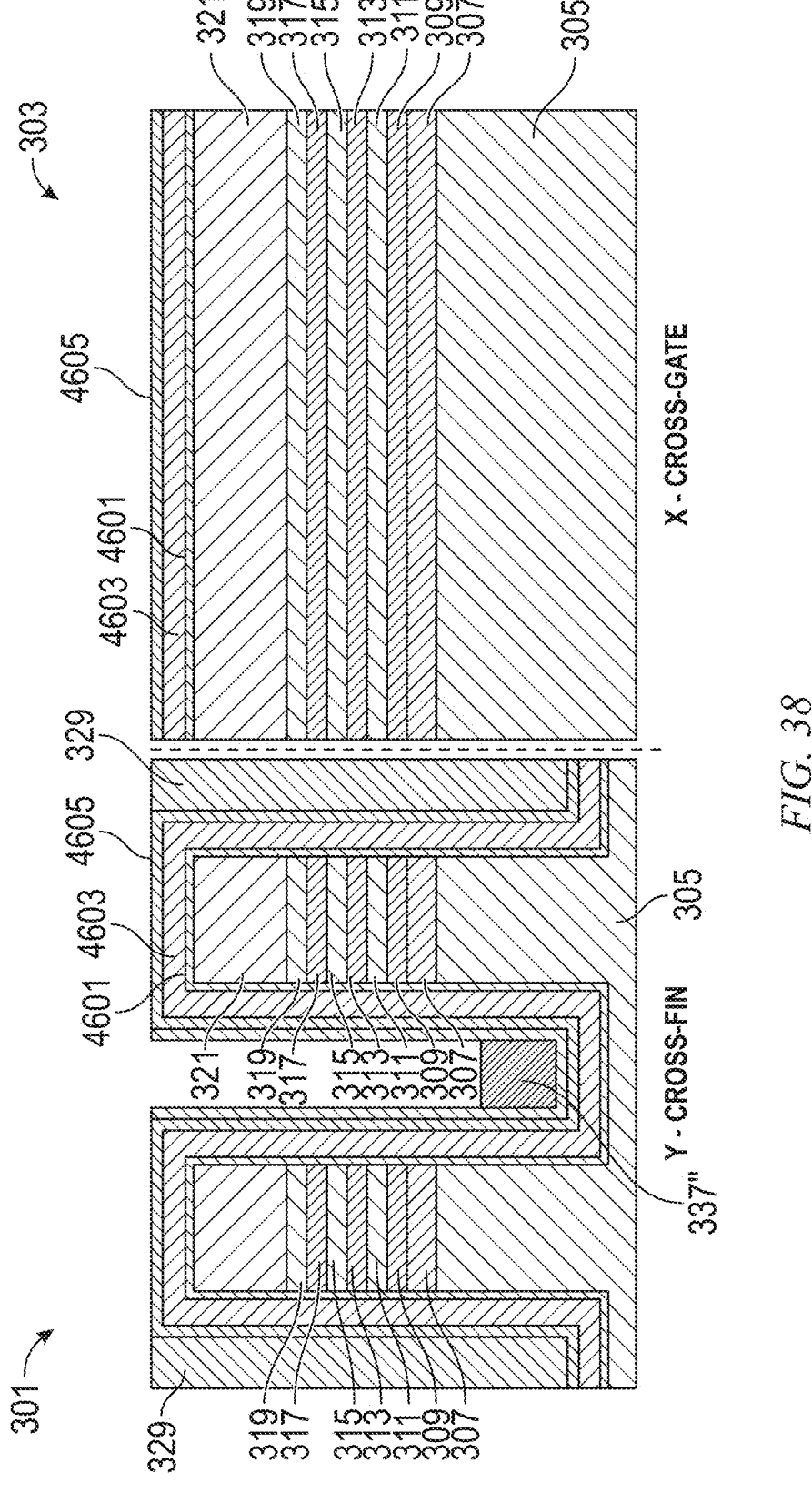
Figure 39:
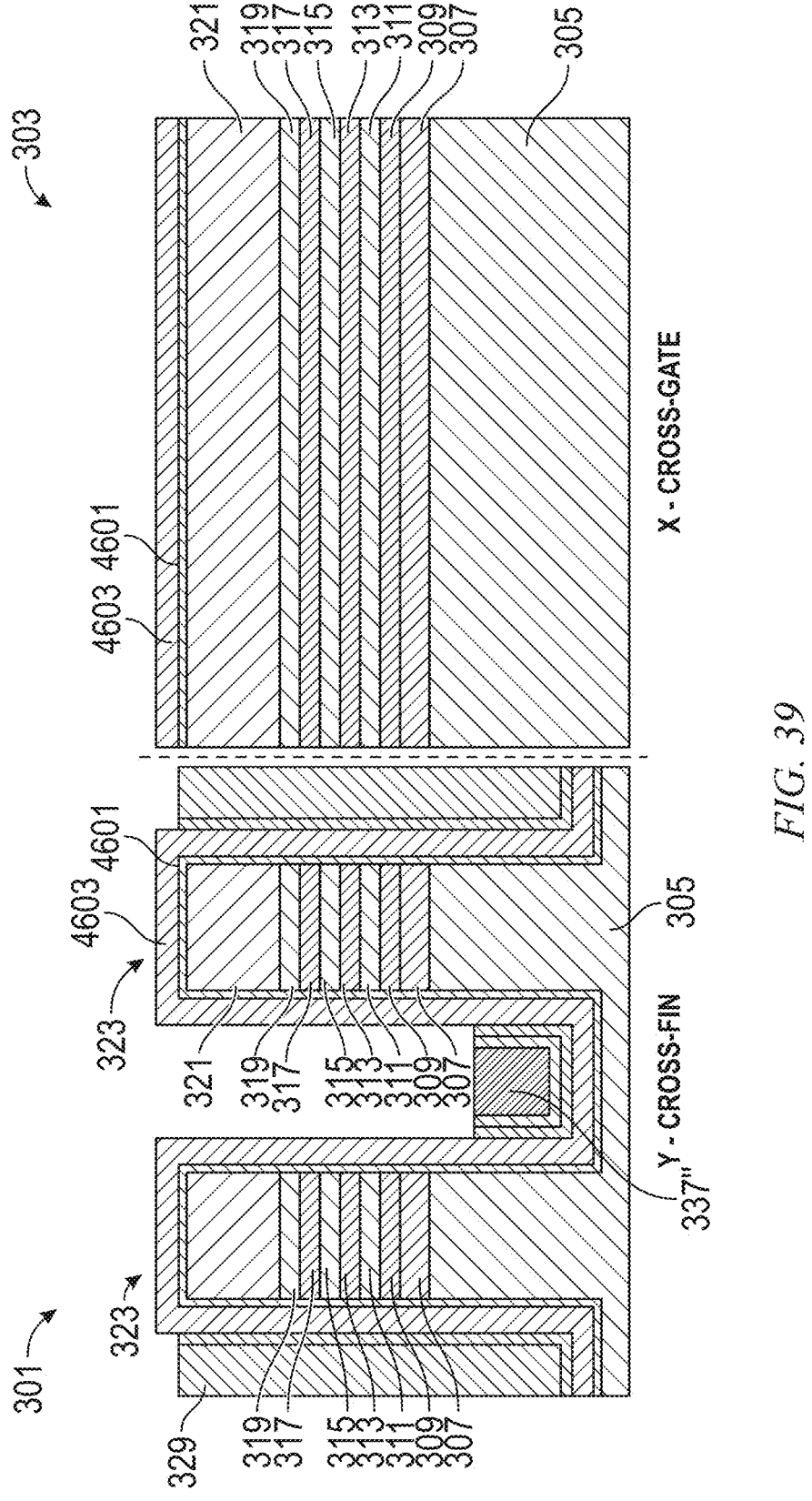
Figure 40:
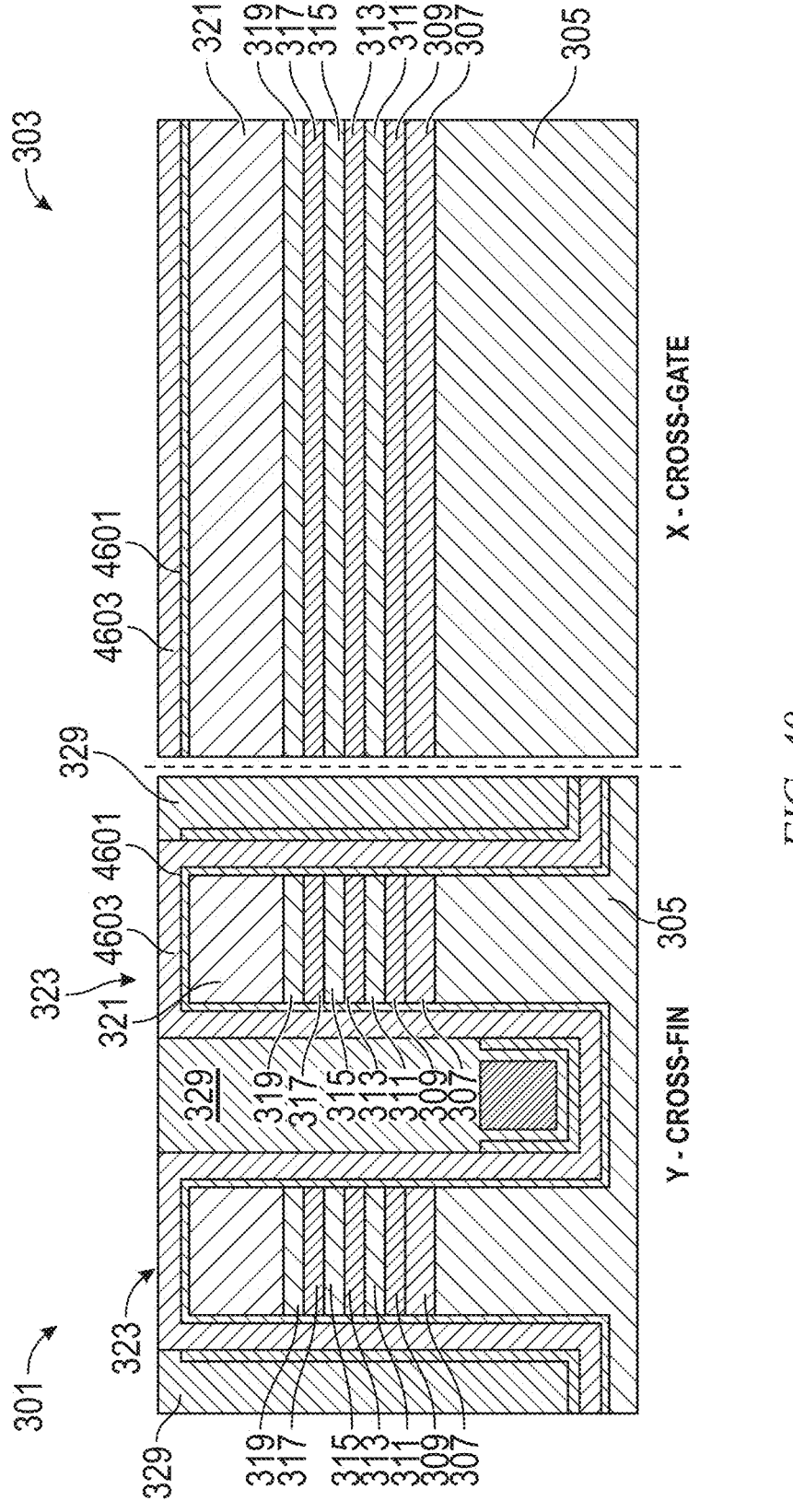
Figures 41, 42:
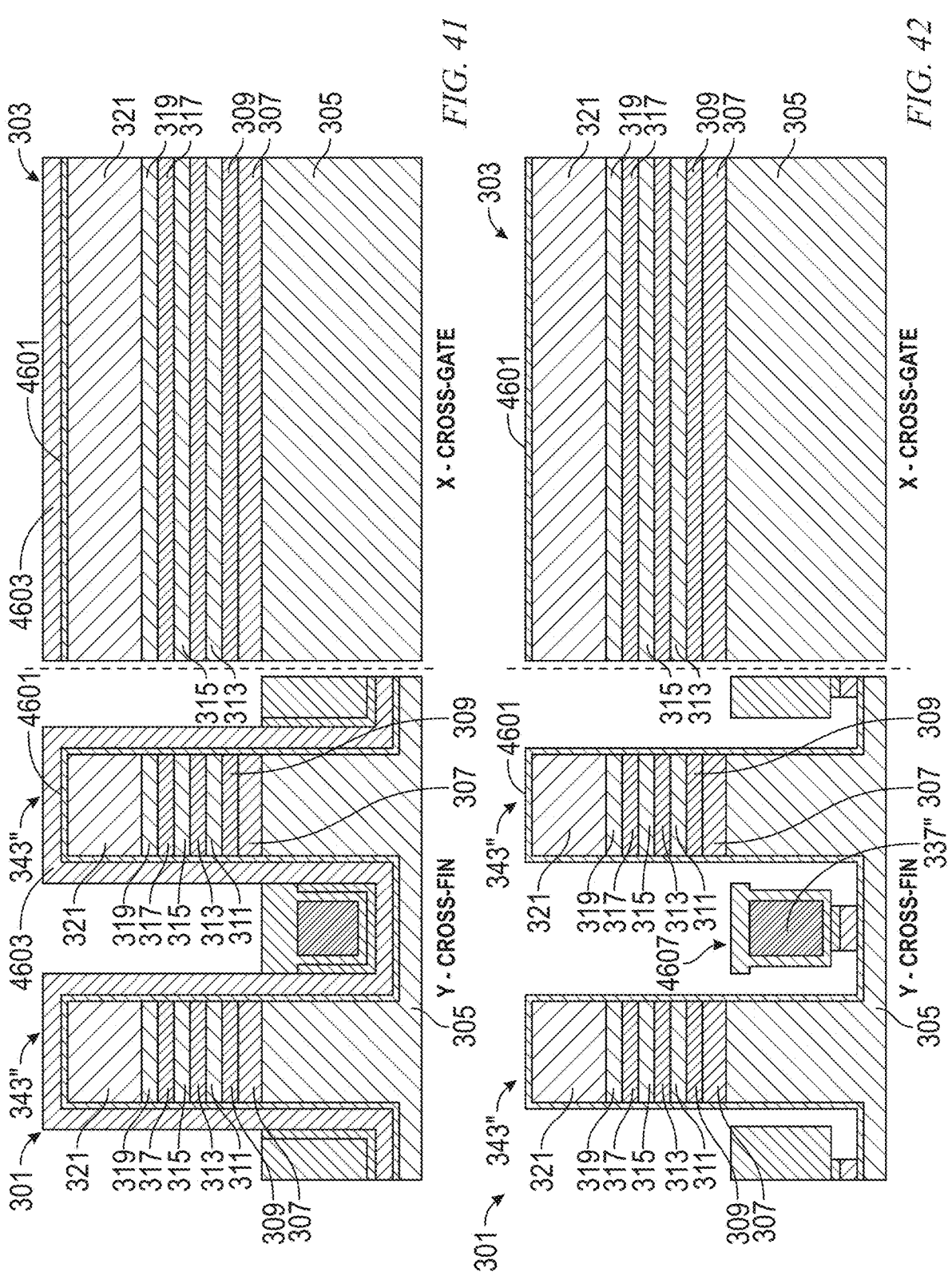
Figures 43, 44:
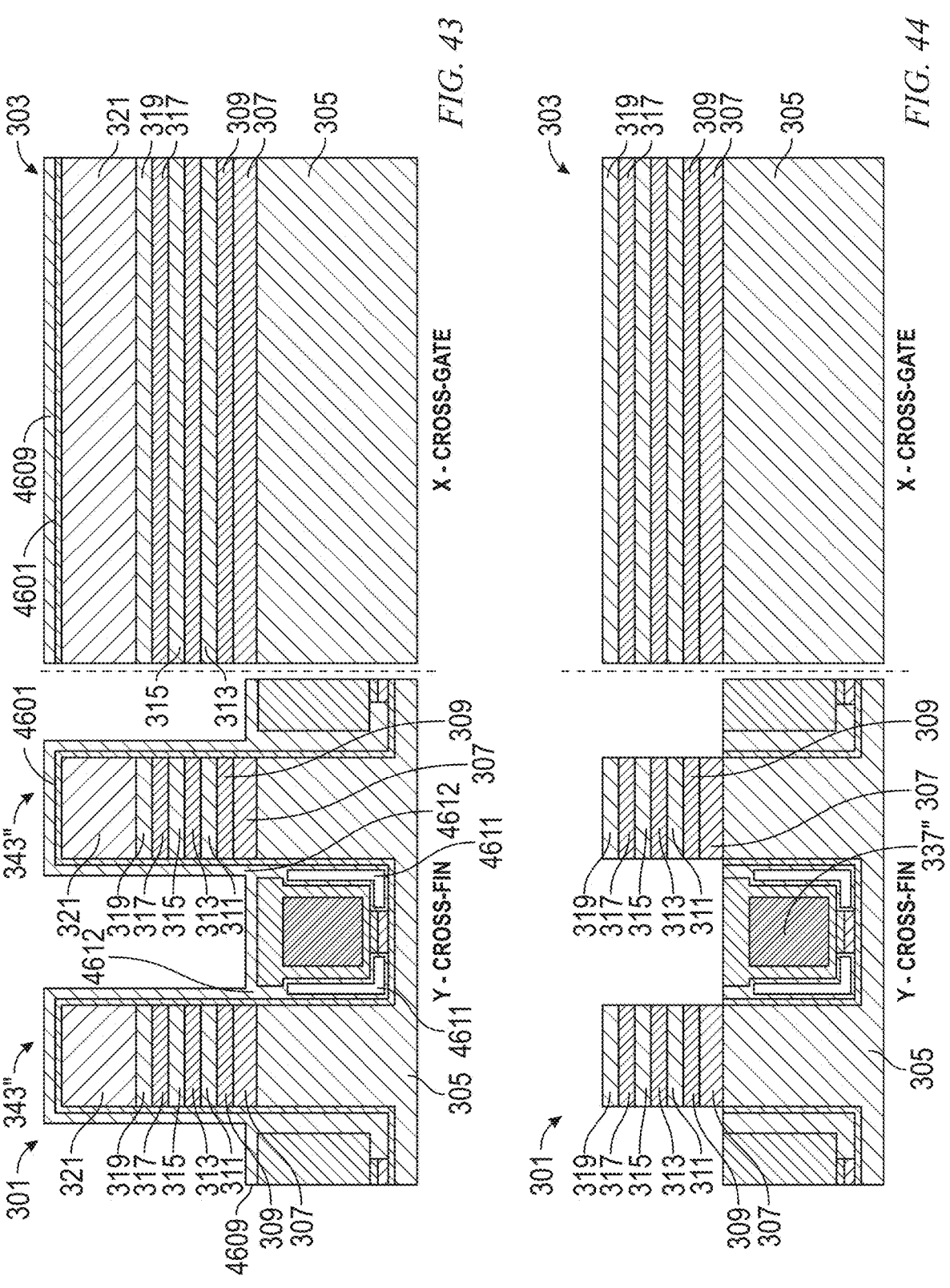

Consider now a third exemplary process flow for an exemplary embodiment of nanosheet transistors with buried power rails and an air gap liner, including robust air-gap formation and an air gap localized only in the BPR regions. It should be noted that except to the extent that differences are discussed and pointed out, the steps and corresponding structures of the first, second, and third exemplary process flows are generally similar. Initial steps are similar to FIGS. 3 and 4; the intermediate structure of FIG. 4 can be taken as a starting point. In FIG. 34, carry out shallow trench isolation tri-liner deposition; for example, an inner layer 4601 of SiO; an intermediate layer 4603 of SiN; and an outer layer 4605 of TiO$_x$ (Titanium oxide) or AlO$_x$. FIGS. 35, 36, 37, and 38 are the same as FIGS. 6, 7, 8, and 9 except that the tri-liner is present instead of layers 325, 327. The BPR here is designated 337". In FIG. 39, isotropically etch the oxide 329 and etch the TiO$_x$ or AlO$_x$ 4605. In FIG. 40 deposit STI oxide (e.g., SiO) 341 and carry out CMP. In FIG. 41, etch to reveal the fins 343". In FIG. 42, over-etch the SiN liner 4603 and etch the TiO$_x$ or AlO$_x$ liner 4605 (last numbered in FIG. 38) to obtain the T-shaped top region 4607 over the BPR 337". In FIG. 43 deposit conformal low-K liner 4609 (e.g., SiBCN). Note at 4612 that the T-shaped top regions result in smaller "canyons" located in the upper portion, which improves pinch-off and air-gap encapsulation. The air gaps are seen at 4611. In FIG. 44, etch back the low-K liner 4609, etch the SiO 4601, and strip the hard mask 321.

Figure 45:
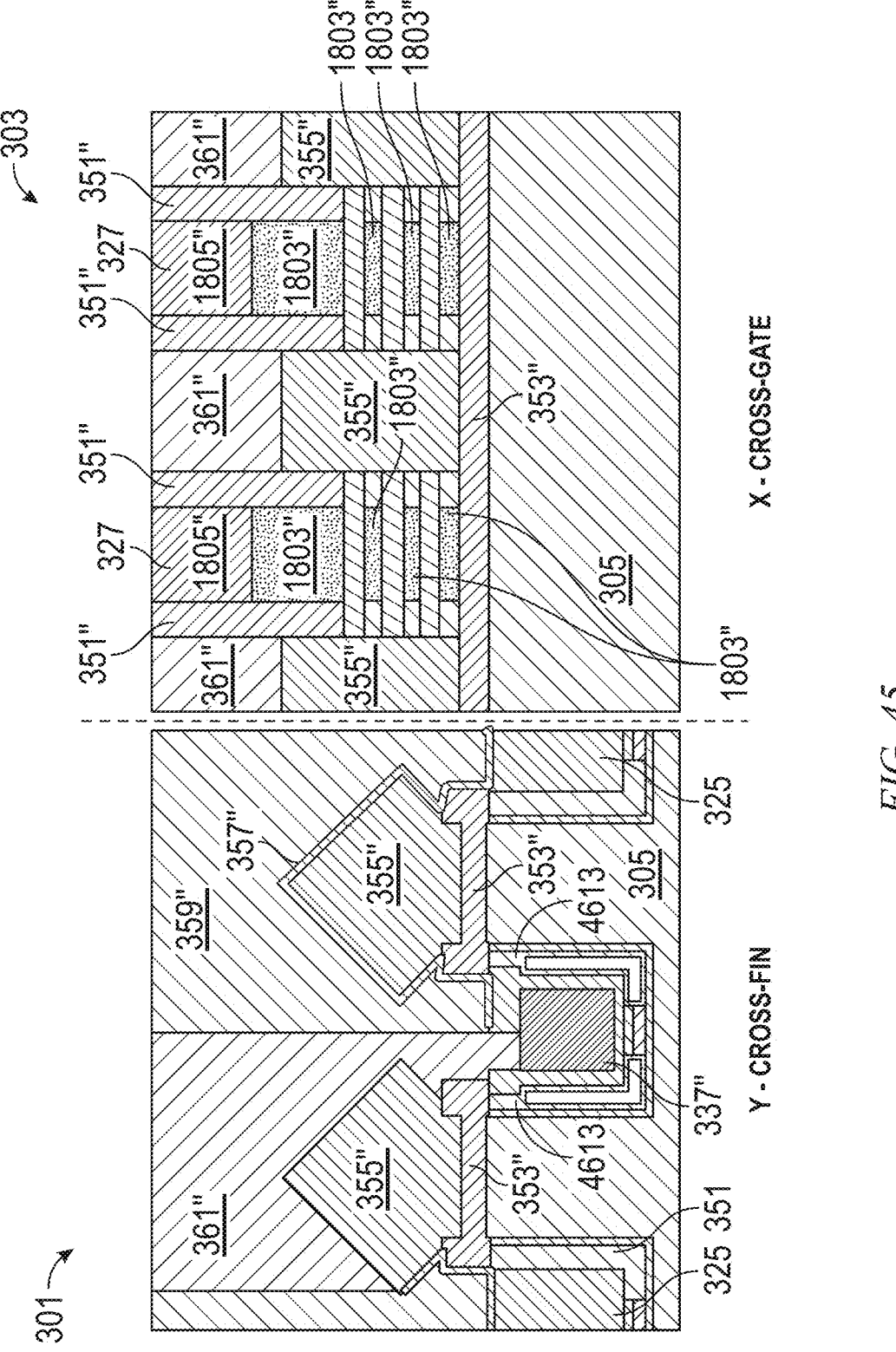
FIG. 45 shows an end result of the process of FIGS. 34-44 (plus additional steps)
Figure 46:
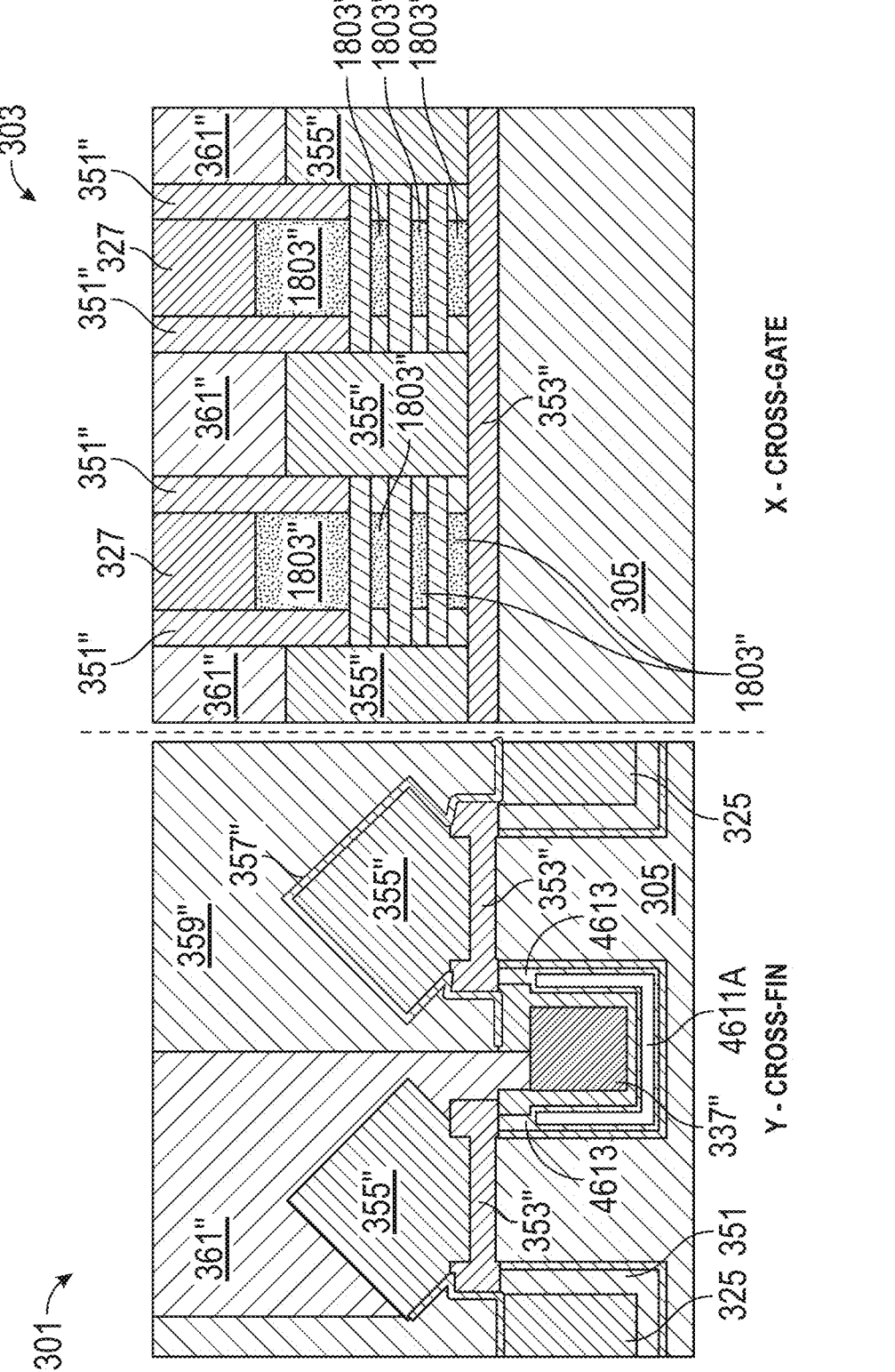
FIGS. 46 and 47 show alternatives to the structure of FIG. 45.
Figure 47:
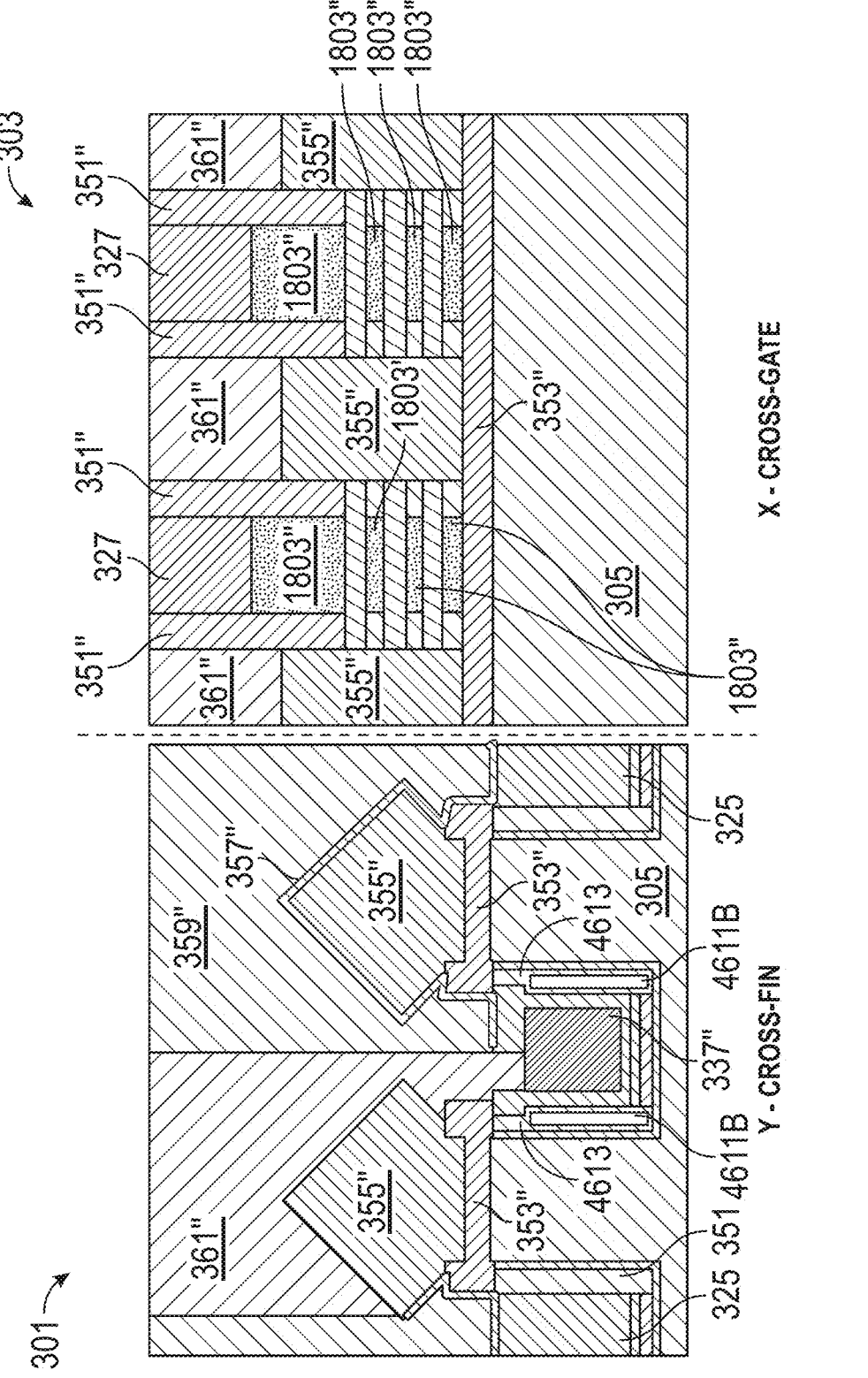

FIG. 45 shows the final structure after formation of the gates, BDI 353", inner spacer, epitaxial growth of the source/drain regions, POC (poly-silicon open CMP), High-k metal gate (HKMG) formation, and formation of trench metal contacts. More specifically, form dummy gates (similar to 345' as discussed above); form the spacer 351" and BDI 353"; and form the source/drain cavities (i.e. carry out fin recess). Form the inner spacers, form the Source-Drain epitaxy 355"; and deposit the CESL 357". Deposit the ILD 359" and carry out CMP; selectively remove the sacrificial a-Si gate (similar to 347' as discussed above), and selectively remove the sacrificial SiGe suspensions (portions of 309, 313, 317 remaining in FIG. 44). Form the conformal High-K metal gate stacks 1803", recess the HKMG stack from the top of the gate, and form self-aligned contact (SAC) caps 1805" over the HKMG. Pattern and etch the cavities for the trench metal contacts 361" in the ILD 359" and selectively remove the CESL 357" in the 361" contact regions. Note that metal 361" can extend over the BPR to contact it. Deposit trench metal contact 361" and carry out CMP. Refer to FIGS. 28-30; processing in the third exemplary process flow is essentially similar; note the difference at 4613 (T-shaped STI with pinching in low-K liner 4609 (numbered in FIG. 43)). FIG. 46 shows a variation for an all-around air gap 4611A formed by fully etching the SiN/TiO liner in FIG. 42. While the BPR may appear to be "floating," it is supported at the extremities in the X-direction (not explicitly shown; the skilled artisan will appreciate this is located to left and right of top view in FIG. 2). FIG. 47 shows another variation with smaller air gaps 4611B for a shallower liner recess formed by reduced etching of the SiN/TiO liner in FIG. 42.

It will thus be appreciated that an exemplary embodiment of a semiconductor structure includes a buried power rail 337, 337', 337", 337P, 337P', formed in between two adjacent nanosheet FETS 355, 355P, 355', 355P', and a shared contact 361, 361P, 361', 361P', between the source and drain of the transistor and the BPR material. The top of the BPR is located below the bottom of the active channels of the FET. The BPR sidewalls are separated from the FET sub-fin sidewalls by at least one dielectric (e.g., a low-K dielectric or an air gap encapsulated by one or more dielectric materials). One or more embodiments include a BPR integrated in the STI material with a dielectric liner 325, 327 or air gap 3299, 3999, 4611, 4611A, 4611B, on the sidewall.

It will be further appreciated that an exemplary method to form a semiconductor device includes forming a nanosheet epitaxy stack (e.g. FIG. 3); forming NS stacks (e.g. FIG. 4); depositing STI liners (e.g. FIG. 5); depositing STI oxide and planarizing (e.g. FIG. 6); patterning the buried power rail (e.g. FIG. 7) and recessing the STI oxide (e.g. FIG. 7); depositing BPR metal and planarizing (FIG. 8); recessing the BPR metal (FIG. 9); depositing STI oxide and planarizing (FIG. 11); recessing the STI oxide (FIG. 12); recessing the top STI liner (FIG. 13); depositing conformal Low-K liner (FIG. 17) or forming an air gap in sealed by conformal Low-K liner (FIG. 32). Refer to more detailed discussion of exemplary method steps elsewhere herein.

One or more embodiments provide techniques for integrated Buried-Power-Rails (BPR) 337, 337', 337", 337P, 337P', in the Shallow-Trench-Isolation (STI) 341 with a dielectric liner 325, 327 or an air gap 3299, 3999, 4611, 4611A, 4611B, isolating the BPR from the sub-Fin sidewalls and substrate 305 to reduce parasitic capacitance. One or more embodiments thus advantageously include reducing parasitic capacitance in an operating integrated circuit by providing such a structure. In one or more embodiments, the BPR integration is presented for Gate-All-Around (GAA) devices and is compatible with Bottom Dielectric Isolation (BDI) 353, 353', 353". The BPR is formed, for example, in place of the STI over the sub-Fin Dielectric liner 325, 327 and in one or more embodiments does not require over etch past the bottom of the STI level. One or more embodiments thus include refraining from such an over-etch. In the case of the air gap (e.g., FIGS. 37, 39, 40, 41, 55, 56, 57, 58), in one or more embodiments, the STI liner is first recessed after forming and encapsulating the BPR in the STI Oxide (e.g., FIG. 30). An air-gap is then encapsulated in place of the STI liner.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. For example, the skilled artisan will be familiar with epitaxial growth, self-aligned contact formation, formation of high-K metal gates, and so on. The term "high-K" has a definite meaning to the skilled artisan in the context of high-K metal gate (HKMG) stacks, and is not a mere relative term. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1<sup>st</sup> Edition, Prentice Hall, 2001 and P. H. Holloway et al., *Handbook of Compound Semiconductors: Growth, Processing, Characterization, and Devices, Cambridge University Press,* 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary semiconductor structure includes a substrate 305 and a first field effect transistor (FET) (e.g., 1907, 1909, 1907', 1909') formed on the substrate and including a first FET first source-drain region (e.g., 355, 355P, 355', 355P'), a first FET second source-drain region (e.g., 355, 355P, 355', 355P'), a first FET gate (see, e.g., stacks in FIGS. 18, 30, and 45) between the first and second source-drain regions, and a first FET channel region (e.g., nanosheet structures as described) adjacent the first FET gate and between the first FET first and second source-drain regions. Also included is a buried power rail 337, 337', 337", buried in the substrate, having a top at a level lower than the first FET channel region, and having buried power rail sidewalls. A first FET shared contact 361, 361', 361" is electrically interconnected with the buried power rail and the first FET second source-drain region. Note that "first" and "second" are for grammatical convenience only and the shared contact can connect to either source-drain region in the device. An electrically isolating region (e.g., liner and/or gap) is located adjacent the buried power rail sidewalls, and separates the buried power rail from the substrate.

One or more instances further include a second field effect transistor (FET) (e.g., 1907, 1909, 1907', 1909'), adjacent the first field effect transistor, formed on the substrate, and including a second FET first source-drain region, a second FET second source-drain region, a second FET gate between the second FET first and second source-drain regions, and a second FET channel region adjacent the second FET gate and between the second FET first and second source-drain regions. In this aspect, the buried power rail is located between the adjacent first and second field effect transistors. See, e.g., top views 1901, 1901'.

In some cases (e.g., FIG. 18), the electrically isolating region 1801 includes an electrically insulating dielectric compound; in another aspect (e.g., FIGS. 30, 32, 33, 45-47), the electrically isolating region includes an encapsulated gap, such as, by way of example, an air gap.

One or more embodiments are implemented in the context of gate all-round nanosheet technology, as shown in the non-limiting exemplary embodiments. Thus, in one or more embodiments, the first field effect transistor channel region includes a first field effect transistor nanosheet channel region; the second field effect transistor channel region includes a second field effect transistor nanosheet channel region; the first field effect transistor gate includes a first field effect transistor all-around gate; and the second field effect transistor gate includes a second field effect transistor all-around gate. However, the skilled artisan will appreciate that techniques disclosed herein can also be employed with, for example, a FinFET that has a fin channel for example.

In another aspect, a semiconductor array structure (e.g., FIG. 19, FIG. 31) includes a substrate and a plurality of field effect transistors formed on the substrate, as described above. the plurality of field effect transistors are arranged in rows. Also included are a plurality of buried power rails, buried in the substrate, each having a top at a level lower than the channel regions of the plurality of FETs, and each having buried power rail sidewalls. A plurality of shared contacts are electrically interconnected with the buried power rails and the second source-drain regions. Electrically isolating regions are located adjacent the buried power rail sidewalls of each of the plurality of buried power rails and separate the buried power rails from the substrate. The buried power rails are located between adjacent rows of the field effect transistors.

In some instances, first adjacent pairs of the rows are n-type 1907, 1907' and second adjacent pairs of the rows are p-type 1909, 1909'.

As discussed above, the electrically isolating regions can include an electrically insulating dielectric compound and/or encapsulated gaps such as air gaps.

As noted, one or more embodiments are implemented in the context of gate all-round nanosheet technology, as shown in the non-limiting exemplary embodiments. Thus, in one or more embodiments, the channel regions include nanosheet channel regions; and the gates include all-around gates.

In accordance with still another aspect of the invention, an exemplary method of forming a semiconductor structure includes epitaxially forming a plurality of nanosheet stacks 323 on a substrate 305 to obtain a first precursor structure (e.g. FIG. 4). The nanosheet stacks are separated by a plurality of gaps, and the first precursor structure has an outer surface. A further step includes depositing at least one shallow trench isolation liner (e.g., 325, 327 or tri-liner) over the outer surface of the first precursor structure (e.g. FIG. 5, FIG. 34) and depositing shallow trench isolation oxide 329 in the plurality of gaps over the at least one liner. Still a further step includes replacing the shallow trench isolation oxide in select ones of the plurality of gaps with buried power rails surrounded by electrically isolating regions (refer, for example, to discussions of patterning the buried power rail (e.g. FIG. 7) and recessing the STI oxide (e.g. FIG. 7); depositing BPR metal and planarizing (FIG. 8); recessing the BPR metal (FIG. 9), and analogous steps in other embodiments). Yet a further step includes forming a plurality of rows of field effect transistors on the substrate, with the buried power rails located between adjacent rows of the field effect transistors. Refer, for example, to above discussion of moving from the structure of FIG. 17 to the final structure in FIG. 18, and analogous steps for the other embodiments.

In one or more embodiments, in the step of replacing the shallow trench isolation oxide in the select ones of the plurality of gaps with the buried power rails surrounded by the electrically isolating regions, the electrically isolating regions include at least one electrically insulating dielectric compound (see, e.g., FIG. 18). For example, the step of replacing the shallow trench isolation oxide in the select ones of the plurality of gaps with the buried power rails surrounded by the electrically isolating regions can include: depositing and patterning an organic dielectric layer (ODL) 331 having a pattern corresponding to the buried power rails (e.g. FIG. 7); recessing the shallow trench isolation oxide in the select ones of the plurality of gaps using the patterned ODL layer to obtain metal-receiving regions; depositing metal for the buried power rails in the metal-receiving regions (FIG. 8); recessing the deposited buried power rail metal (FIG. 9); and depositing buried power rail conformal liner material over the buried power rails (FIG. 10), wherein the buried power rail conformal liner material and the shallow trench isolation liner cooperatively form the electrically isolating regions.

In some instances, in the step of replacing the shallow trench isolation oxide in the select ones of the plurality of gaps with the buried power rails surrounded by the electrically isolating regions, the electrically isolating regions each include an encapsulated gap (e.g., FIGS. 30, 32, 33, 45-47). For example, the step of replacing the shallow trench isolation oxide in the select ones of the plurality of gaps with the buried power rails surrounded by the electrically isolating regions can include: depositing and patterning an organic dielectric layer (ODL) 331' having a pattern corresponding to the buried power rails (e.g. FIG. 20); recessing the shallow trench isolation oxide in the select ones of the plurality of gaps using the patterned ODL layer to obtain metal-receiving regions; depositing metal for the buried power rails in the metal-receiving regions (FIG. 21); recessing the deposited buried power rail metal (FIG. 22); etching at least a portion of (FIG. 25) the shallow trench isolation liner adjacent the buried power rails to form at least a partial gap; and encapsulating the at least partial gap to create the encapsulated gaps (FIG. 26, FIG. 43).

In some instances, the etching of the at least portion of the shallow trench isolation liner adjacent the buried power rails to form the at least a partial gap includes complete etching (FIG. 32, FIG. 46) to form an all-around gap when viewed from a cross-fin perspective.

In some cases, the etching of the at least portion of the shallow trench isolation liner adjacent the buried power rails to form the at least a partial gap includes partial etching to leave an underlying support pedestal (FIG. 25 partial-width pedestal, FIG. 33 full-width pedestal) when viewed from a cross-fin perspective.

In some cases, in the step of depositing the at least one shallow trench isolation liner, the at least one shallow trench isolation liner includes a tri-liner (FIG. 34); for example, an inner layer 4601 of SiO; an intermediate layer 4603 of SiN; and an outer layer 4605 of $TiO_x$ (Titanium oxide) or $AlO_x$.

Those skilled in the art will appreciate that the exemplary structures discussed above can be distributed in raw form (i.e., a single wafer having multiple unpackaged chips), as bare dies, in packaged form, or incorporated as parts of intermediate products or end products.

An integrated circuit in accordance with aspects of the present inventions can be employed in essentially any application and/or electronic system. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure comprising:
a substrate;
a first field effect transistor (FET) formed on the substrate and comprising a first FET first source-drain region, a first FET second source-drain region, a first FET gate between the first and second source-drain regions, and a first FET channel region adjacent the first FET gate and between the first FET first and second source-drain regions;
a buried power rail, buried in the substrate, having a top at a level lower than the first FET channel region, and having buried power rail sidewalls;
a first FET shared contact electrically interconnected with the buried power rail and the first FET second source-drain region;
a bottom dielectric isolation located between and electrically isolating the substrate and the first FET first and second source-drain regions;
a first FET electrically isolating region directly adjacent and separating the bottom dielectric isolation and the buried power rail sidewalls, and separating the buried power rail from the substrate, the first FET electrically isolating region including a first FET shallow trench isolation liner in direct contact with the substrate and the bottom dielectric isolation;
a contact etch-stop liner extending around the first FET first source-drain region except for a section of the first FET first source-drain region that is in contact with the first FET shared contact; and
an inter-layer dielectric located directly adjacent to the first FET first and second source-drain regions, the first FET shared contact, and the contact etch-stop liner, wherein the contact etch-stop liner is, at least partially, sandwiched between the inter-layer dielectric and the first FET electrically isolating region.

2. The semiconductor structure of claim 1, further comprising a second field effect transistor (FET), adjacent the first field effect transistor, and formed on the substrate and comprising a second FET first source-drain region, a second FET second source-drain region, a second FET gate between the second FET first and second source-drain regions, and a second FET channel region adjacent the second FET gate and between the second FET first and second source-drain regions;
wherein the buried power rail is located between the adjacent first and second field effect transistors.

3. The semiconductor structure of claim 2, wherein the electrically isolating region comprises an electrically insulating dielectric compound.

4. The semiconductor structure of claim 2, wherein the electrically isolating region comprises an encapsulated gap.

5. The semiconductor structure of claim 4, wherein the gap comprises an air gap.

6. The semiconductor structure of claim 2, wherein:
the first field effect transistor channel region comprises a first field effect transistor nanosheet channel region;
the second field effect transistor channel region comprises a second field effect transistor nanosheet channel region;
the first field effect transistor gate comprises a first field effect transistor all-around gate; and
the second field effect transistor gate comprises a second field effect transistor all-around gate.

7. A semiconductor array structure comprising:
a substrate;
a plurality of field effect transistors formed on the substrate, each comprising a first source-drain region, a second source-drain region, a gate between the first and second source-drain regions, and a channel region adjacent the gate and between the first and second source-drain regions, the plurality of field effect transistors being arranged in lateral rows;
a plurality of buried power rails, buried in the substrate, each having a top at a level lower than the channel regions, each having buried power rail sidewalls;
a plurality of shared contacts electrically interconnected with the buried power rails and the second source-drain regions;
bottom dielectric isolation located between and electrically isolating the substrate and the first and second source-drain regions of the plurality of field effect transistors;
electrically isolating regions directly adjacent and separating the bottom dielectric isolation and the buried power rail sidewalls of each of the plurality of buried power rails, and separating the buried power rails from the substrate, the electrically isolating regions including a shallow trench isolation liner in direct contact with the substrate and the bottom dielectric isolation; and
an inter-layer dielectric located directly adjacent to the first and second source-drain regions of the plurality of field effect transistors, the plurality of shared contacts, and a contact etch-stop liner sandwiched between the inter-layer dielectric the electrically isolating regions,
wherein the buried power rails are located between adjacent rows of the field effect transistors; and
wherein first adjacent pairs of the lateral rows are n-type and second adjacent pairs of the lateral rows are p-type.

8. The semiconductor array structure of claim 7, wherein the electrically isolating regions comprise an electrically insulating dielectric compound.

9. The semiconductor array structure of claim 7, wherein the electrically isolating regions comprise encapsulated gaps.

10. The semiconductor array structure of claim 9, wherein the gaps comprises air gaps.

11. The semiconductor array structure of claim 7, wherein:
the channel regions comprise nanosheet channel regions; and
the gates comprise all-around gates.

12. The semiconductor array structure of claim 7, further comprising the contact etch-stop liner extending around the first source-drain regions except for sections of the first source-drain regions that are in contact with the shared contacts.

* * * * *